United States Patent [19]
Yamada

[11] Patent Number: 5,708,602
[45] Date of Patent: Jan. 13, 1998

[54] NON-VOLATILE SEMICONDUCTOR MEMORY DEVICE AND METHOD FOR VERIFYING OPERATING OF THE SAME

[75] Inventor: Shigekazu Yamada, Kawasaki, Japan

[73] Assignee: Fujitsu Limited, Kanagawa, Japan

[21] Appl. No.: 740,567

[22] Filed: Oct. 30, 1996

[30] Foreign Application Priority Data

Apr. 16, 1996 [JP] Japan ..................... 8-094071

[51] Int. Cl.$^6$ ..................... G11C 7/00
[52] U.S. Cl. ............... 365/185.2; 365/185.22; 365/185.29
[58] Field of Search ............ 365/185.2, 185.21, 365/185.22, 185.29, 185.24, 210

[56] References Cited

U.S. PATENT DOCUMENTS

| 5,444,656 | 8/1995 | Bauer et al. ............. 365/185.2 |
| 5,602,775 | 2/1997 | Vo ........................ 365/185.29 |

Primary Examiner—David C. Nelms
Assistant Examiner—Vu A. Le
Attorney, Agent, or Firm—Nikaido, Marmelstein, Murray & Oram LLP

[57] ABSTRACT

A non-volatile semiconductor memory device includes a first memory cell which is electrically erasable and programmable and stores data, a second memory cell which is electrically erasable and programmable and has a threshold voltage which is set by performing erase and write operations on the second memory separately from erase and write operations on the first memory, and a sense amplifier comparing currents respectively flowing in the first and second memory cells to sense a state of the first memory cell. A verify voltage supply circuit supplies, in an erase verify operation, control gates of the first and second memory cells with erase verify voltages dependent on an actual value of the threshold voltage of the second memory cell, and supplies, in a write verify operation, the control gates of the first and second memory cells with write verify voltages dependent on an actual value of the threshold voltage of the second memory cell. Hence, the erase and write verify operations can duly be carried out even if the threshold voltage of the second memory cell actually derives from a target value.

8 Claims, 23 Drawing Sheets

IEB : TARGET ERASE VERIFY CURRENT
IWB : TARGET WRITE VERIFY CURRENT

IEB : TARGET ERASE VERIFY CURRENT
IWB : TARGET WRITE VERIFY CURRENT

NON-VOLATILE SEMICONDUCTOR MEMORY DEVICE AND METHOD FOR VERIFYING OPERATING OF THE SAME

BACKGROUND OF THE INVENTION

1. Field of the Invention

The present invention generally relates to non-volatile semiconductor memory devices, and more particularly to electrically erasable and programmable semiconductor memory devices, such as flash memory devices. The present invention is further concerned with a method of verifying operations of such electrically erasable and programmable semiconductor memory devices.

2. Description of the Related Art

FIG. 1 is a block diagram of an essential part of a flash memory device. The device includes a cell matrix 1 in which memory cells are arranged in matrix formation, and an address latch circuit 2 which latches address signals A0–A20 externally supplied to the memory device. The memory device includes an X decoder 3, which decodes X address signals (row address signals) included in the address signals A0–A20 latched in the address latch circuit 2 and selects a word line.

The memory device includes a Y decoder 4, which decodes Y address signals (column address signals) included in the address signals A0–A20 latched in the address latch circuit 2 and outputs a resultant column select signal. The memory device includes a Y gate 5, which selects a column on the basis of the column select signal output by the Y decoder 4.

The memory device includes an input/output buffer 6, which transfers data DQ0–DQ7 between the memory device and an external device. The memory device includes a data latch circuit 7, which latches data DQ0–DQ7 read from the cell matrix 1 and latches data DQ0–DQ7 input to the input/output buffer 6.

The memory device includes a CE/OE logic circuit 8, which inputs a chip enable signal /CE and an output enable signal /OE and controls the Y decoder 4 and the input/output buffer 6. The memory device includes a state controller 9, which inputs a write enable signal /WE and the chip enable signal /CE and sets a mode.

The memory device includes a write voltage generating circuit 10, a negative erase voltage generating circuit 11, and a sector/switch circuit The write voltage generating circuit 10 generates a write voltage VPP. The negative erase voltage generating circuit 11 generates a negative voltage Vm for use in an erase operation. The sector/switch circuit 12 supplies the negative erase voltage Vm output by the circuit 11 to a selected sector.

FIG. 2 is a cross-sectional view of one of the memory cells arranged in the cell matrix 1. The memory cell shown in FIG. 2 includes a P-type silicon substrate 14, a source 15 formed of an N-type diffused region, a drain 16 formed of an N-type diffused region, a floating gate 17 and a control gate 18.

Data is written into the memory cell shown in FIG. 2 in the following manner. For example, a source voltage Vs is set equal to 0 V, a drain voltage Vd is set equal to 5–6 V, and a control gate voltage Vcg is set equal to 12 V. In this state, electrons are applied to the floating gate 17 from the drain 16.

The data thus written into the memory cell can be erased in the following manner. For example, the source voltage Vs is set equal to 5 V (power supply voltage VCC), the drain 16 is set to the open state, and the control gate voltage Vcg is set equal to −8.5 V (negative erase voltage Vm). In this state, the electrons are drawn from the floating gate 17 to the source 15.

The data can be read from the memory cell in the following manner. For example, the source voltage Vs is set equal to 0 V, the drain voltage Vd is set equal to 1 V, and the control gate voltage Vcg is set equal to 5 V. The data can be read by detecting a drain current in the above state.

FIG. 3 is a schematic circuit diagram of a structure of a sense amplifier provided in the flash memory device shown in FIG. 1. In FIG. 3, there are illustrated a memory cell 20 arranged in the cell matrix 1 and used to store data (hereinafter such a memory cell is referred to as a real cell), and a memory cell 21 for reference (comparison) (hereinafter such a memory cell is referred to as a reference cell).

A state decoder 22 is provided in the state controller 9, and controls the control gate voltage of the reference cell 21 on the basis of various states such as an erase state, an erase verify state, a write state and a write verify state. An N-type MOS transistor (hereinafter such a type of transistor is referred to as an nMOS transistor) 23 is provided between the real cell 20 and a sense amplifier 25. Similarly, an nMOS transistor 24 is provided between the reference cell 21 and the sense amplifier 25. The nMOS transistors 23 and 24 are turned ON/OFF by the column select signal (VCC/VSS).

The sense amplifier 25 is a current-sense type sense amplifier and is provided in the data latch circuit 7. The sense amplifier 25 includes data lines 26 and 27, current sense circuits 28 and 29, and a differential amplifier 30. A symbol OUT denotes the output terminal (signal) of the sense amplifier 25. The current sense circuit 28 senses a current flowing in the data line 26. The current sense circuit 29 senses a current flowing in the data line 27. The differential amplifier circuit 30 is provided with output voltages V28 and V29 of the current sense circuits 28 and 29.

The current sense circuit 28 includes P-type MOS transistors (hereinafter such a type of transistor is referred to as pMOS transistor) 31 and 31, and nMOS transistors 35 and 36. The current sense circuit 29 includes pMOS transistors 33 and 34, and nMOS transistors 37 and 38. The differential amplifier circuit 30 includes pMOS transistors 39 and 40, and nMOS transistors 41–43.

The erase verify operation on the real cell 20 is carried out as follows. The nMOS transistors 23 and 24 are turned ON. An erase verify voltage VEB20 for the real cell is applied to the control gate of the real cell 20 via the X decoder 3. An erase verify voltage VEB21 for the reference cell is applied to the control gate of the reference cell 21 via the state decoder 22. In the above state, the sense amplifier 25 compares the current flowing in the data line 26 with the current flowing in the data line 27.

The write verify operation on the real cell 20 is carried out as follows. The nMOS transistors 23 and 24 are turned ON. A write verify voltage VWB20 for the real cell is applied to the gate of the real cell 20 via the X decoder 3. A write verify voltage VWB21 for the reference cell is applied to the control gate of the reference cell 21 via the state decoder 22. In the above state, the sense amplifier 25 compares the current flowing in the data line 26 with the current flowing in the data line 27.

A read operation in which data is read from the real cell 20 is carried out as follows. The nMOS transistors 23 and 24 are turned ON. The read voltage VCC is applied to the control gate of the real cell 20 via the X decoder 3. Further, the read voltage VCC is applied to the control gate of the reference cell 21 via the state decoder 22. In the above state, the sense amplifier compares the current flowing in the data line 26 with the current flowing in the data line 27.

FIG. 4 is a graph of a drain current (Id) vs control gate voltage (Vcg) of the reference cell 21. In the graph of FIG. 4, reference numbers 45, 46, 47, 48 and 49 indicate the Vcg-Id characteristics of the reference cell 21 when the threshold voltage VTH21 of the reference cell 21 is respectively V1, V2, V3, V4 and V5 (0<V1<V2<V3<V4<V5). The voltage V3 is the target voltage of the threshold voltage VTH21.

In the erase verify operation, it is determined that erasing of data stored in the real cell 20 is completed when a drain current greater than the target verify current IEB flowing in the reference cell 21 flows in the real cell 20 in the case where the threshold voltage VTH21 of the reference cell 21 is equal to the target value V3.

In the write verify operation, it is determined that writing of data into the real cell 20 is completed when a drain current smaller than the target write verify current IWB flowing in the reference cell 21 in the case where the threshold voltage VTH21 of the reference cell 21 is equal to the target value V3.

FIG. 5 is a circuit diagram of a configuration of a threshold voltage setting circuit for setting the threshold voltage VTH21 of the reference cell 21 provided in the conventional flash memory device shown in FIG. 1. The circuit shown in FIG. 5 includes a write voltage output terminal 10A of the write voltage generating circuit 10, and a negative erase voltage output terminal 11A of the negative erase voltage generating circuit 11. The circuit shown in FIG. 5 further includes a pMOS transistor 51, which is turned ON/OFF by a write (programming) signal /PGM, and an nMOS transistor 52 having a gate to which the ground voltage VSS is applied. The circuit shown in FIG. 5 further includes a pMOS transistor 53, which is turned ON/OFF by an erase signal ERASE, and a pMOS transistor 54, which is turned ON/OFF by the write signal /PGM. The circuit shown in FIG. 5 further includes a pMOS transistor 55, which is turned ON/OFF by the erase signal /ERASE, and an nMOS transistor 56, which is turned ON/OFF by the erase signal /ERASE.

The setting of the threshold voltage VTH21 of the reference cell 21 is carried out by performing the erase operation on the reference cell 21 and then performing the write operation thereon.

More particularly, in the erase operation, the write signal /PGM and the erase signal ERASE are set equal to the high level, and the erase signal /ERASE is thus set equal to the low level. In this state, the negative erase voltage Vm is output by the negative erase voltage generating circuit 11. Hence, the transistors 51–56 are set to the following states:

pMOS transistor 51 OFF
nMOS transistor 52 ON
pMOS transistor 53 OFF
pMOS transistor 54 OFF
pMOS transistor 55 ON
nMOS transistor 56 OFF.

Hence, in the above case, the negative erase voltage Vm output by the negative erase voltage generating circuit 11 is applied to the control gate of the reference cell 21 via the nMOS transistor 52 and the state decoder 22. The power supply voltage VCC is applied to the source of the reference cell 21 via the pMOS transistor 55. Hence, data can be erased from the reference cell 21.

In the write operation, the write signal /PGM and the erase signal ERASE are set equal to the low level, and the erase signal /ERASE is thus set equal to the high level. The negative erase voltage output terminal 11A of the negative erase voltage generating circuit 11 is set equal to the ground voltage VSS. In this case, the transistors 51–56 are set to the following states:

pMOS transistor 51 ON
nMOS transistor 52 OFF
pMOS transistor 53 ON
pMOS transistor 54 ON
pMOS transistor 55 OFF
nMOS transistor 56 ON.

Hence, in the above case, the write voltage VPP output by the write voltage generating circuit 10 is applied to the control gate of the reference cell 21 via the pMOS transistor 51 and the state decoder 22. The power supply voltage VCC is applied to the drain of the reference cell 21 via the nMOS transistor 54. The ground voltage VSS is applied to the source of the reference cell 21 via the nMOS transistor 56. In this manner, data is written into the reference cell 21, so that the threshold voltage VTH21 of the reference cell 21 can be set.

FIG. 6 is a circuit diagram of a configuration of a verify voltage generating circuit for the real cell provided in the conventional flash memory device shown in FIG. 1. The circuit shown in FIG. 6 includes resistors 58, 59 and 60, a pMOS transistor 61, and a pMOS transistor 62. The resistors 58, 59 and 60 divide the power supply voltage VCC and thus produce a resistor-divided voltage. The pMOS transistor 61 is turned ON/OFF by a write verify signal /PGM*VERIFY. The pMOS transistor 62 is turned ON/OFF by an erase verify signal ERASE*VERIFY. The erase verify signal VEB20 for the real cell is available at node N1, and the write verify voltage VWB20 for the real cell is available at node N2.

In the erase verify operation, the write verify signal /PGM*VERIFY is set equal to the high level, and the erase verify signal /ERASE*VERIFY is set equal to the low level. Hence, the pMOS transistor 61 is OFF, and the pMOS transistor 62 is ON. Thus, the erase verify voltage VEB20 for the real cell obtained at the node N1 is applied to the control gate of the real cell 20 via the pMOS transistor 62 and the X decoder 3.

In the write verify operation, the write verify signal /PGM*VERIFY is set equal to the low level, and the erase verify signal /ERASE*VERIFY is set equal to the high level. Hence, the pMOS transistor 61 is ON, and the pMOS transistor 62 is OFF. Thus, the write verify voltage VWB20 for the real cell obtained at the node N2 is applied to the control gate of the real cell 20 via the pMOS transistor 61 and the X decoder 3.

FIG. 7 is a circuit diagram of a configuration of a verify voltage generating circuit for the reference cell provided in the conventional flash memory shown in FIG. 1. The circuit shown in FIG. 7 includes resistors 64–66, a pMOS transistor 67, and a pMOS transistor 68. The resistors 64–66 divide the power supply voltage VCC and thus produce a resistor-divided voltage. The pMOS transistor 67 is turned ON/OFF by the write verify signal /PGM*VERIFY. The pMOS transistor 68 is turned ON/OFF by the erase verify signal /ERASE*VERIFY. The erase verify signal VEB21 for the reference cell is available at node N3, and the write verify voltage VWB21 for the reference cell is available at node N4.

In the erase verify operation, the write verify signal /PGM*VERIFY is set equal to the high level, and the erase verify signal /ERASE*VERIFY is set equal to the low level. Hence, the pMOS transistor 67 is OFF, and the pMOS transistor 68 is ON. Thus, the erase verify voltage VEB21 for the reference cell obtained at the node N3 is applied to the control gate of the reference cell 21 via the pMOS transistor 68 and the state decoder 22.

In the write verify operation, the write verify signal /PGM*VERIFY is set equal to the low level, and the erase verify signal /ERASE*VERIFY is set equal to the high level. Hence, the pMOS transistor 67 is ON, and the pMOS transistor 68 is OFF. Thus, the write verify voltage VWB21 for the reference cell obtained at the node N4 is applied to the control gate of the reference cell 21 via the pMOS transistor 67 and the state decoder 22.

As shown in FIG. 4, if the threshold voltage VTH21 of the reference cell 21 becomes lower than the target value V3 and becomes equal to, for example, V2 or V1, it cannot be determined whether the erase operation is completed unless the real cell 20 is set to an over-erase state in the erase verify operation.

If the threshold voltage VTH21 of the reference cell 21 becomes higher than the target value V3 and becomes equal to, for example, V4 or V5, it cannot be determined, in the write verify operation, whether the write operation on the real cell 20 is completed due to a leakage current permitted to the real cell 20.

SUMMARY OF THE INVENTION

It is a general object of the present invention to provide a non-volatile semiconductor memory device and a method of verifying operations of such a memory device in which the above disadvantages are eliminated.

A more specific object of the present invention is to provide a non-volatile semiconductor memory device and a method of verifying operations of such a memory device in which an erase verify operation and a write verify operation can duly be carried out even if the threshold voltage of a non-volatile memory cell serving as a reference cell deviates from the target value.

The above objects of the present invention are achieved by a non-volatile semiconductor memory device comprising: a first memory cell which is electrically erasable and programmable and stores data; a second memory cell which is electrically erasable and programmable and has a threshold voltage which is set by performing erase and write operations on the second memory cell separately from erase and write operations on the first memory cell; a sense amplifier comparing currents respectively flowing in the first and second memory cells to sense a state of the first memory cell; and a verify voltage supply circuit which supplies, in an erase verify operation, control gates of the first and second memory cells with erase verify voltages dependent on an actual value of the threshold voltage of the second memory cell, and supplies, in a write verify operation, the control gates of the first and second memory cells with write verify voltages dependent on an actual value of the threshold voltage of the second memory cell. Hence, the erase and write verify operations can duly be carried out even if the threshold voltage of the second memory cell actually deviates from a target value.

The verify voltage supply circuit may comprise: a first part which supplies, in the erase verify operation, the control gate of the first memory cell with a first erase verify voltage assuming that the threshold voltage of the second memory cell is equal to the target value, and supplies, in the write verify operation, the control gate of the first memory cell with a first write verify voltage assuming that the threshold voltage of the second memory cell is equal to the target value; and a second part which supplies, in the erase verify operation, the control gate of the second memory cell with a second erase verify voltage which reflects the actual value of the threshold voltage of the second memory cell, and supplies, in the write verify operation, the control gate of the second memory cell with a second write verify voltage which reflects the actual value of the threshold voltage of the second memory cell.

In the above structure, the verify voltage supply circuit may comprise first and second verify voltage generating circuits. The first verify voltage generating circuit may comprise: a first resistance element having a first end supplied with a first voltage, and a second end; a second resistance element having a first end connected to the second end of the first resistance element, and a second end; a third resistance element having a first end connected to the second end of the second resistance element, and a second end; a third memory cell which is an electrically erasable and programmable non-volatile memory cell, and has a drain connected to the second end of the third resistance element and a threshold voltage that is set by erase and write operations under the same voltage condition as that for the second memory cell; and a first switch element having a first end connected to a source of the third memory cell, and a second end supplied with a second voltage lower than the first voltage. In the erase and write verify operations, the third memory cell and the first switch element are in a conducting state so that the second erase verify voltage is obtained at the second end of the second resistance element and the second write verify voltage is obtained at the first end of the second resistance element. The second verify voltage generating circuit supplies, in the erase verify operation, the control gate of the second memory cell with the second erase verify voltage and supplies, in the write verify operation, the control gate of the second memory cell with the second write verify voltage.

The verify voltage supply circuit may comprise: a first part which supplies, in the erase verify operation, the control gate of the first memory cell with a third erase verify voltage which reflects the actual value of the threshold voltage of the second memory cell, and supplies, in the write verify operation, the control gate of the first memory cell with a third write verify voltage which reflects the actual value of the threshold voltage of the second memory cell; and a second part which supplies, in the erase verify operation, the control gate of the second memory cell with a fourth erase verify voltage assuming that the threshold voltage of the second memory cell is equal to the target value, and supplies in the write verify operation, the control gate of the second memory cell with a fourth write verify voltage assuming that the threshold voltage of the second memory cell is equal to the target value.

In the above structure, the verify voltage supply circuit may comprise first and second verify voltage generating circuits. The first verify voltage generating circuit may comprise: a third memory cell which is an electrically erasable and programmable non-volatile memory cell, and has a drain supplied with a first voltage and a threshold voltage that is set by erase and write operations under the same voltage condition as that for the second memory cell; a first switch element having a first end connected to a source of the third memory cell, and a second end; a first resistance element having a first end connected to the second end of the first switch element, and a second end; a second resistance element having a first end connected to the second end of the first resistance element, and a second end; a third resistance element having a first end connected to the second end of the second resistance element, and a second end supplied with a second voltage lower than the first voltage. In the erase and write verify operations, the third memory cell and the first switch element are in a conducting state, so that the third erase verify voltage is obtained at the second end of the second resistance element, and the third write verify voltage is obtained at the first end of the second resistance element. The second verify voltage Generating circuit supplies, in the erase verify operation, the control gate of the first memory cell with the third erase verify voltage obtained at the second end of the second resistance element, and supplies, in the write verify operation, the control gate of the first memory cell with the third write verify voltage obtained at the first end of the second resistance element.

The above objects of the present invention are also achieved by a method of verifying operations of a non-volatile semiconductor memory device comprising: a first memory cell which is electrically erasable and programmable and stores data; a second memory cell which is electrically erasable and programmable and has a threshold voltage which is set by performing erase and write operations on the second memory separately from erase and write operations on the first memory; and a sense amplifier comparing currents respectively flowing in the first and second memory cells to sense a state of the first memory cell, the method comprising the steps of: a) supplying, in an erase verify operation, control gates of the first and second memory cells with erase verify voltages dependent on an actual value of the threshold voltage of the second memory cell; and b) supplying, in a write verify operation, the control gates of the first and second memory cells with write verify voltages dependent on an actual value of the threshold voltage of the second memory cell. Hence, the erase and write verify operations can duly be carried out even if the threshold voltage of the second memory cell actually deviates from a target value.

The above objects of the present invention are also achieved by a non-volatile semiconductor memory device comprising: a first memory cell which is electrically erasable and programmable and stores data; a second memory cell which is electrically erasable and programmable and has a threshold voltage which is set by performing erase and write operations on the second memory separately from erase and write operations on the first memory; a sense amplifier comparing currents respectively flowing in the first and second memory cells to sense a state of the first memory cell; and a verify voltage supply circuit which supplies, in an erase verify operation, control gates of the first and second memory cells with erase verify voltages dependent on an actual value of the threshold voltage of the second memory cell, whereby the erase verify operation can duly be carried out even if the threshold voltage of the second memory cell actually derives from a target value.

The above-mentioned objects of the present invention are also achieved by a non-volatile semiconductor memory device comprising: a first memory cell which is electrically erasable and programmable and stores data; a second memory cell which is electrically erasable and programmable and has a threshold voltage which is set by performing erase and write operations on the second memory separately from erase and write operations on the first memory; a sense amplifier comparing currents respectively flowing in the first and second memory cells to sense a state of the first memory cell; and a verify voltage supply circuit which supplies, in a write verify operation, the control gates of the first and second memory cells with write verify voltages dependent on an actual value of the threshold voltage of the second memory cell, whereby the write verify operation can duly be carried out even if the threshold voltage of the second memory cell actually derives from a target value.

BRIEF DESCRIPTION OF THE DRAWINGS

Other objects, features and advantages of the present invention will become more apparent from the following detailed description when read in conjunction with the accompanying drawings, in which:

FIG. 3 is a circuit diagram of a sense FIG. 1;

DESCRIPTION OF THE PREFERRED EMBODIMENTS

Figure 8:
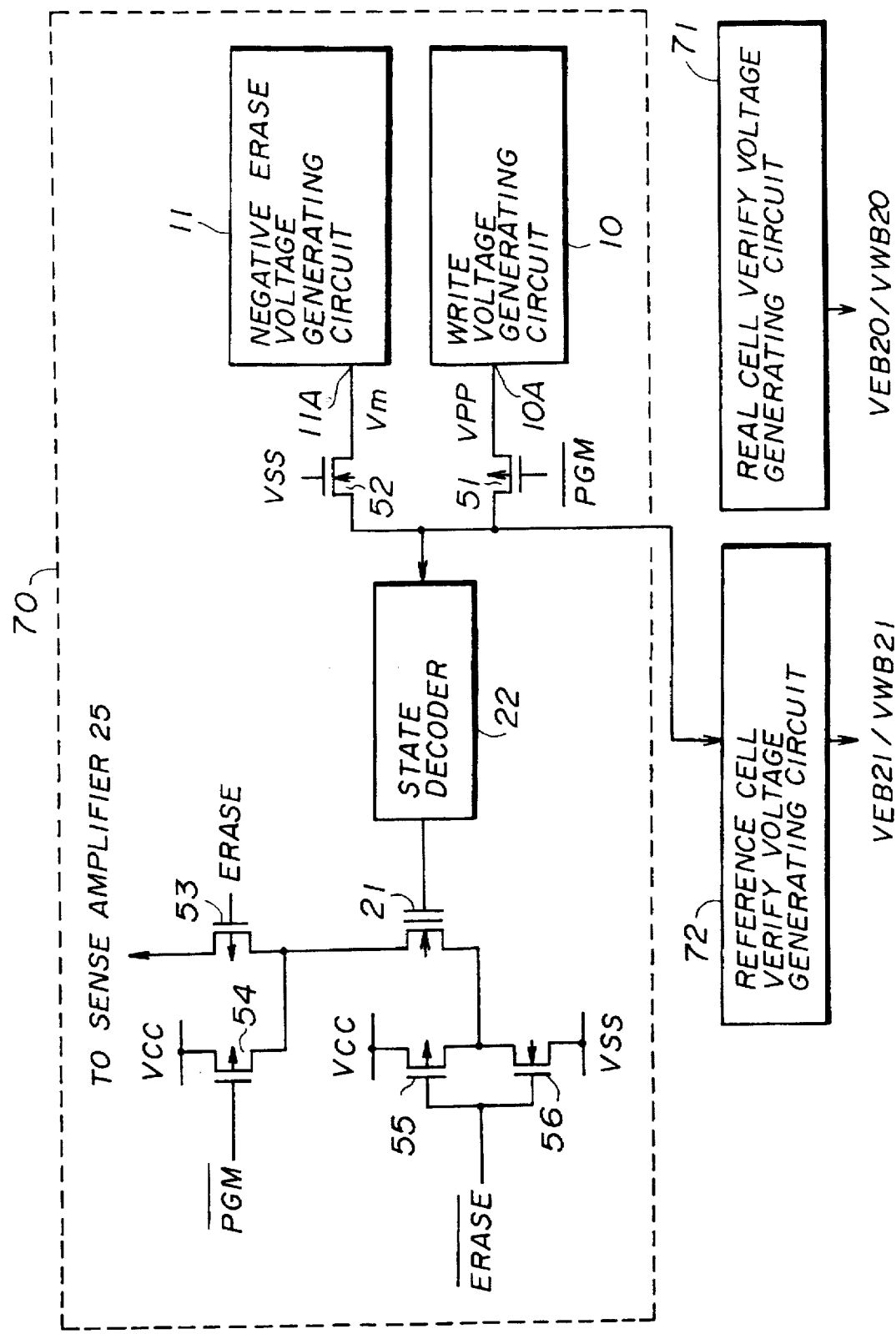
FIG. 8 is a circuit diagram of a part of a non-volatile semiconductor memory device according to a first embodiment of the present invention.

FIG. 8 is a circuit diagram of a part of a non-volatile semiconductor memory device according to a first embodiment of the present invention. The device shown in FIG. 8 includes a threshold voltage setting circuit 70. In FIG. 8, there are also illustrated a real cell verify voltage generating circuit 71 which generates verify voltages for real cells, and a reference cell verify voltage generating circuit 72 which generates verify voltages for reference cells. The real cell verify voltage generating circuit 71 selectively outputs either an erase verify voltage VEB20 for the real cells or a write verify voltage VWB20 for the real cells. The reference cell verify voltage generating circuit 72 selectively outputs either an erase verify voltage WEB21 for the reference cells or a write verify voltage VWB21 for the reference cells.

Figure 6:
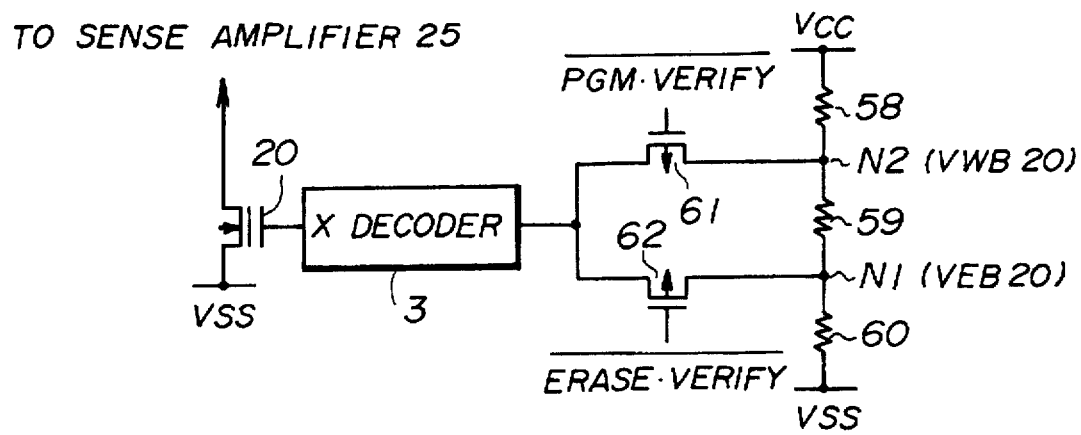
FIG. 6 is a circuit diagram of a circuit of generating a verify voltage for the real cells.

The real cell verify voltage generating circuit 71 shown in FIG. 8 is configured in the same manner as the real cell verify voltage generating circuit provided in the conventional flash memory device shown in FIG. 6. The reference cell verify voltage generating circuit 72 shown in FIG. 8 has a configuration different from that of the reference cell verify voltage generating circuit shown in FIG. 7.

Figure 5:
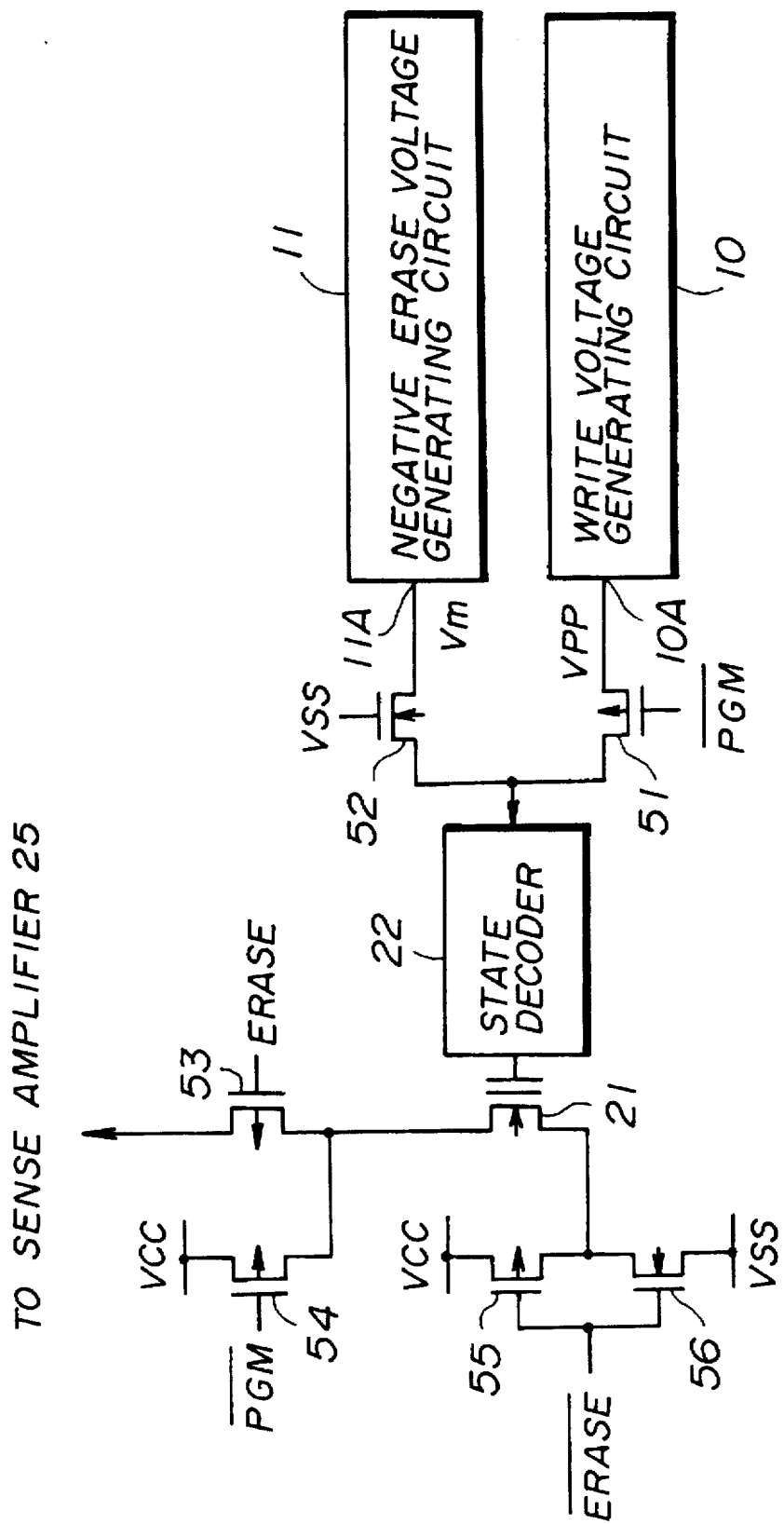
FIG. 5 is a circuit diagram of a threshold voltage setting circuit for setting the threshold voltage of the reference cell.
Figure 7:
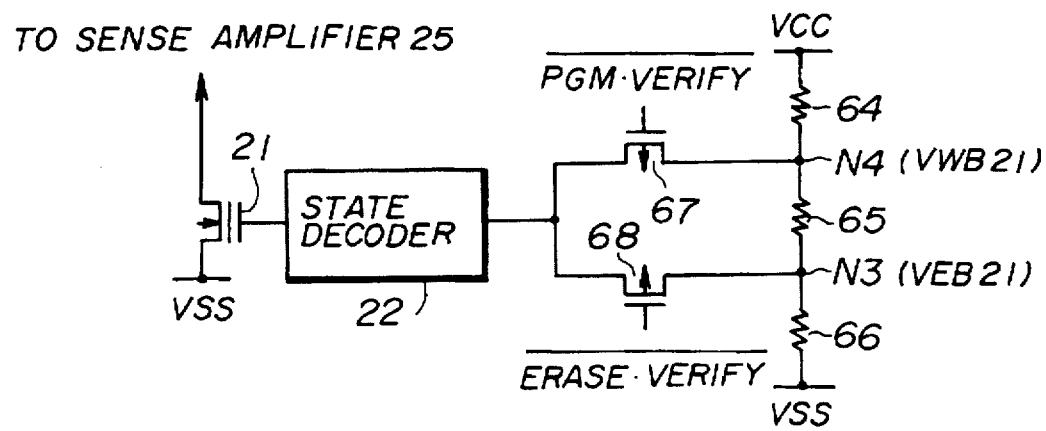
FIG. 7 is a circuit of generating a verify voltage for the reference cells.

According to the first embodiment of the present invention, the threshold voltage setting circuit shown in FIG. 5 and the reference cell verify voltage generating circuit shown in FIG. 7 provided in the conventional flash memory device are respectively replaced by the threshold voltage setting circuit 70 and the reference cell voltage verify voltage generating circuit 72. The parts of the non-volatile semiconductor memory device according to the first embodiment of the present invention are configured in the same manner as those of the conventional flash memory device shown in FIG. 1.

A first verify voltage supply circuit can be defined so that it is made up of the real cell verify voltage generating circuit 71, the X decoder 3, the reference cell verify voltage generating circuit 72 and the state decoder 22. A second verify voltage supply circuit can be defined so that it is made up of the real cell verify voltage generating circuit 71, and the X decoder 3. A third verify voltage supply circuit can be defined so that it is made up of the reference cell verify voltage generating circuit 72, and the state decoder 22.

The threshold voltage setting circuit 70 is configured in the same manner as the threshold voltage setting circuit shown in FIG. 5 except that the threshold voltage setting circuit 70 selectively provides the reference cell verify voltage generating circuit 72 with the negative erase voltage Vm output by the negative erase voltage generating circuit 11 and the write voltage VPP output by the write voltage generating circuit 10.

Figure 9:
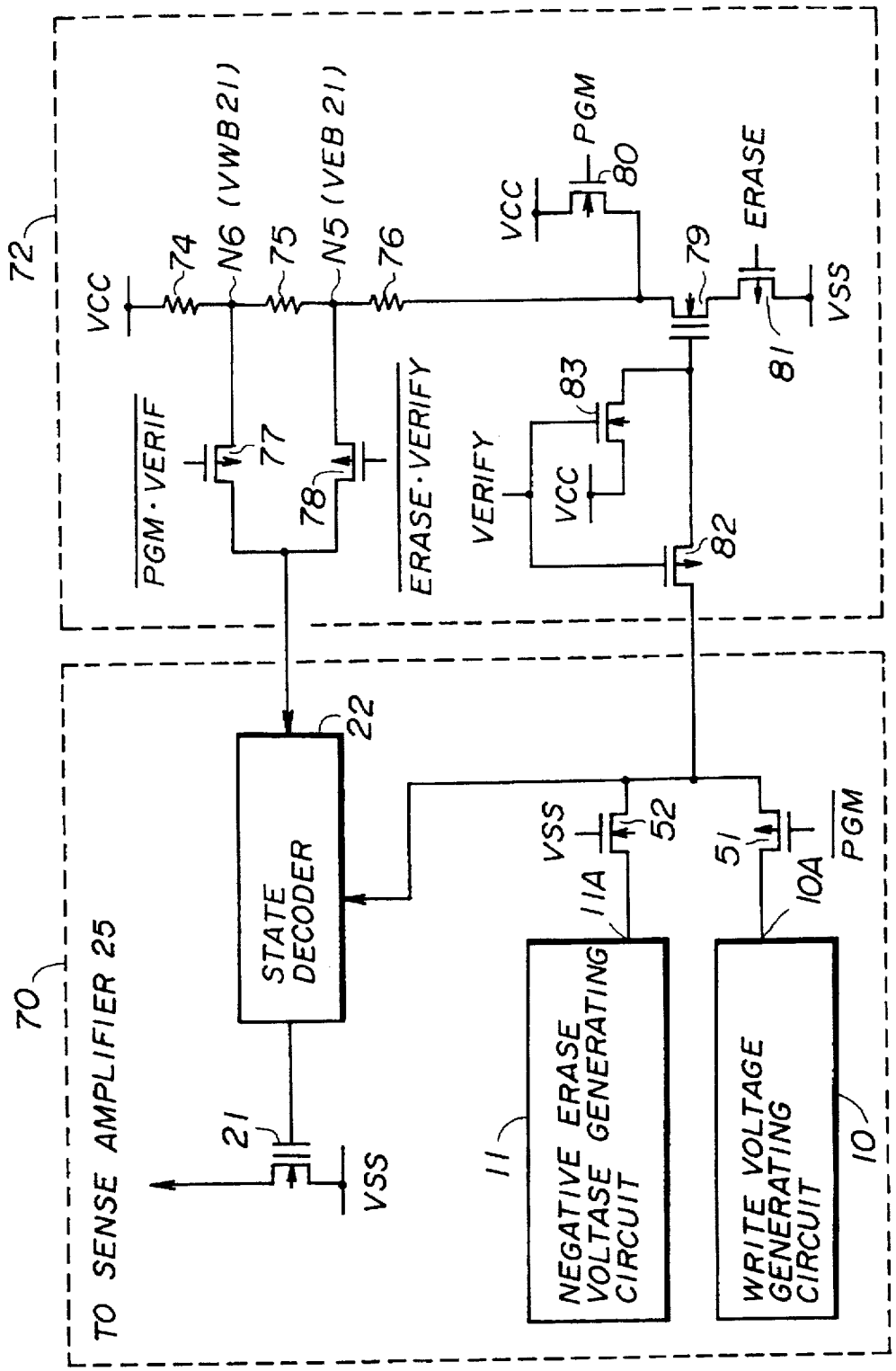
FIG. 9 is a circuit diagram of part of a threshold voltage setting circuit shown in FIG. 8 and a configuration of a reference cell verify voltage generating circuit shown in FIG. 8.

The reference cell verify voltage generating circuit 72 is configured as shown in FIG. 9, and includes resistors 74, 75 and 76, which are examples of resistance elements. The circuit 72 includes a pMOS transistor 77 and a pMOS transistor 78. The pMOS transistor 77 is turned ON/OFF by the write verify signal /PGM*VERIFY. The pMOS transistor 78 is turned ON/OFF by the erase verify signal /ERASE*VERIFY.

The circuit 72 includes a verify voltage control cell 79, which has the same configuration as the aforementioned reference cell 21. The circuit 72 further includes an nMOS transistor 80, which is turned ON/OFF by the write signal PGM, and a pMOS transistor 81, which is turned ON/OFF by the erase signal ERASE. The circuit 72 further includes a pMOS transistor 82, which is turned ON/OFF by the verify signal VERIFY, and an nMOS transistor 83, which is turned ON/OFF by the verify signal VERIFY.

In the reference cell verify voltage generating circuit 72, the erase verify voltage VEB21 for the reference cell is available at node N5, and the write verify signal VWB21 for the reference cell is available at node N6.

A fourth verify voltage supply circuit can be made up of the pMOS transistors 77 and 78 and the state decoder 22.

Figure 1:
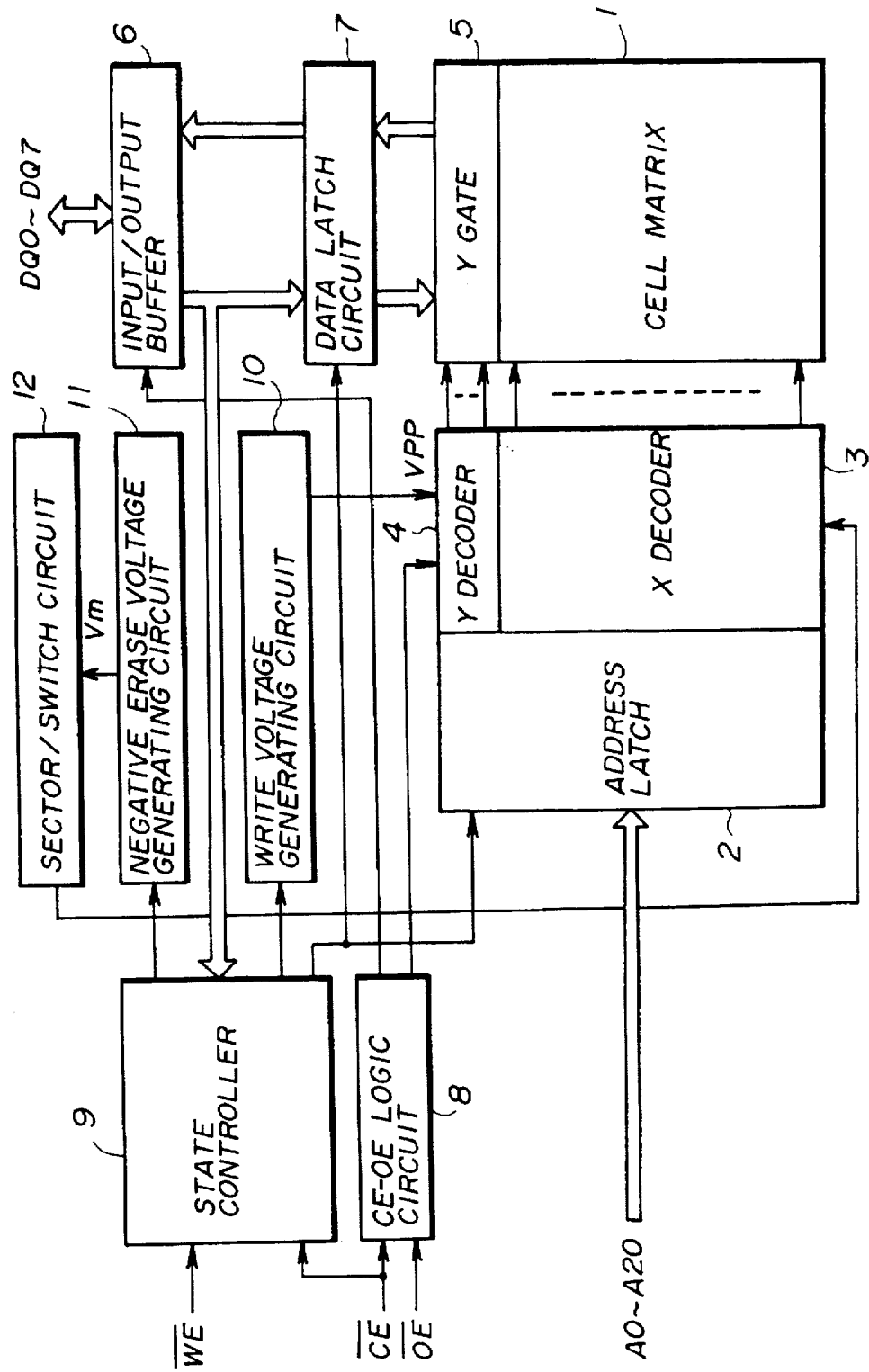
FIG. 1 is a block diagram of a conventional flash memory device.
Figure 2:
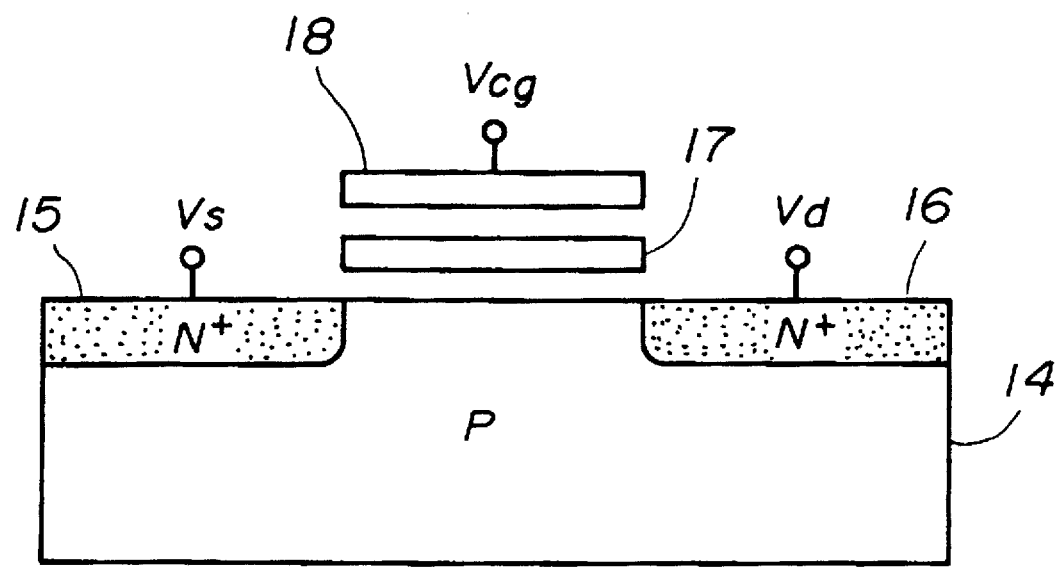
FIG. 2 is a schematic cross-sectional view of a memory cell used in the flash memory device shown in FIG. 1.
Figure 3:
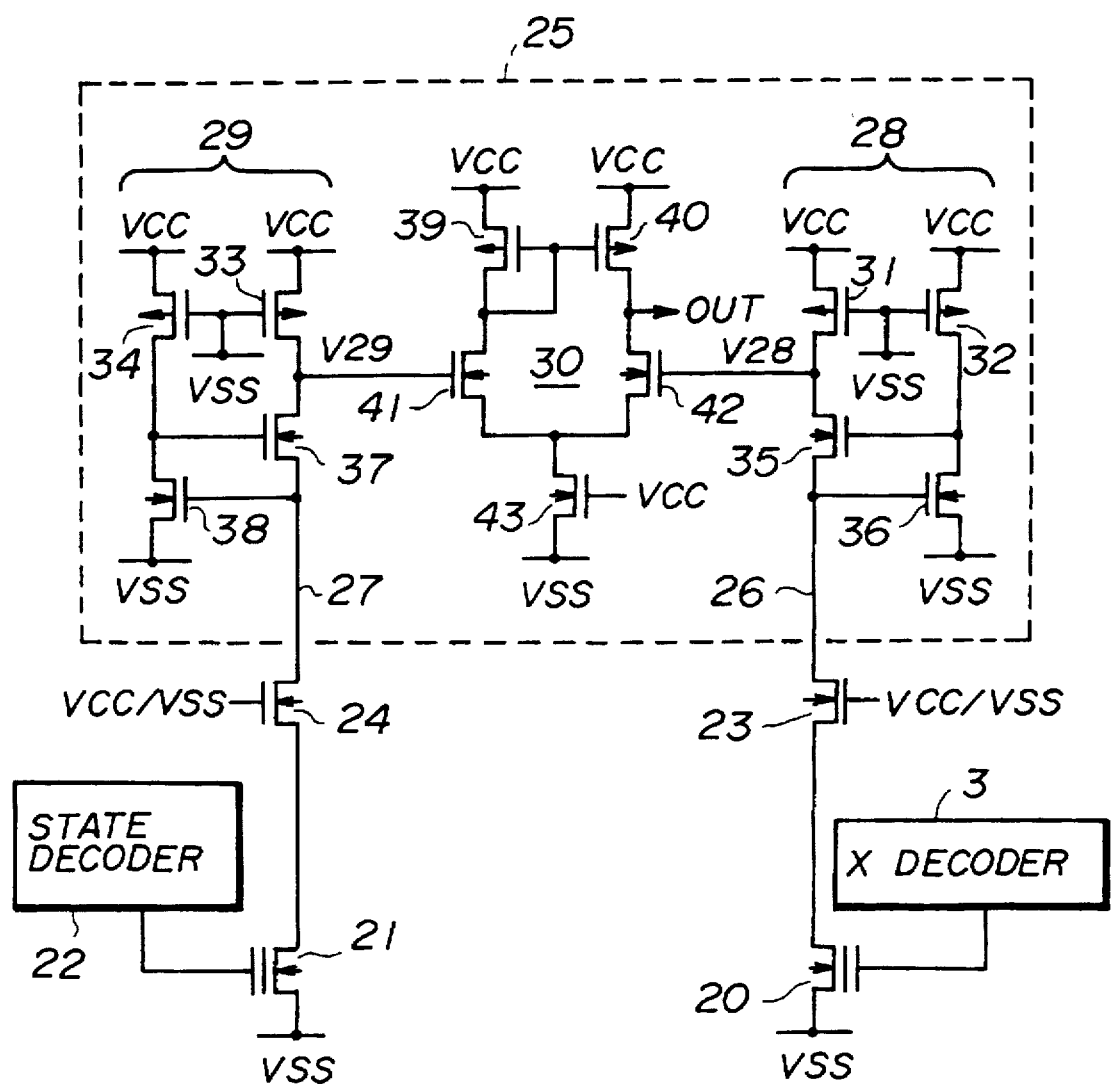
FIG. 3 is a circuit diagram of a sense amplifier provided in the flash memory device shown /
Figure 4:
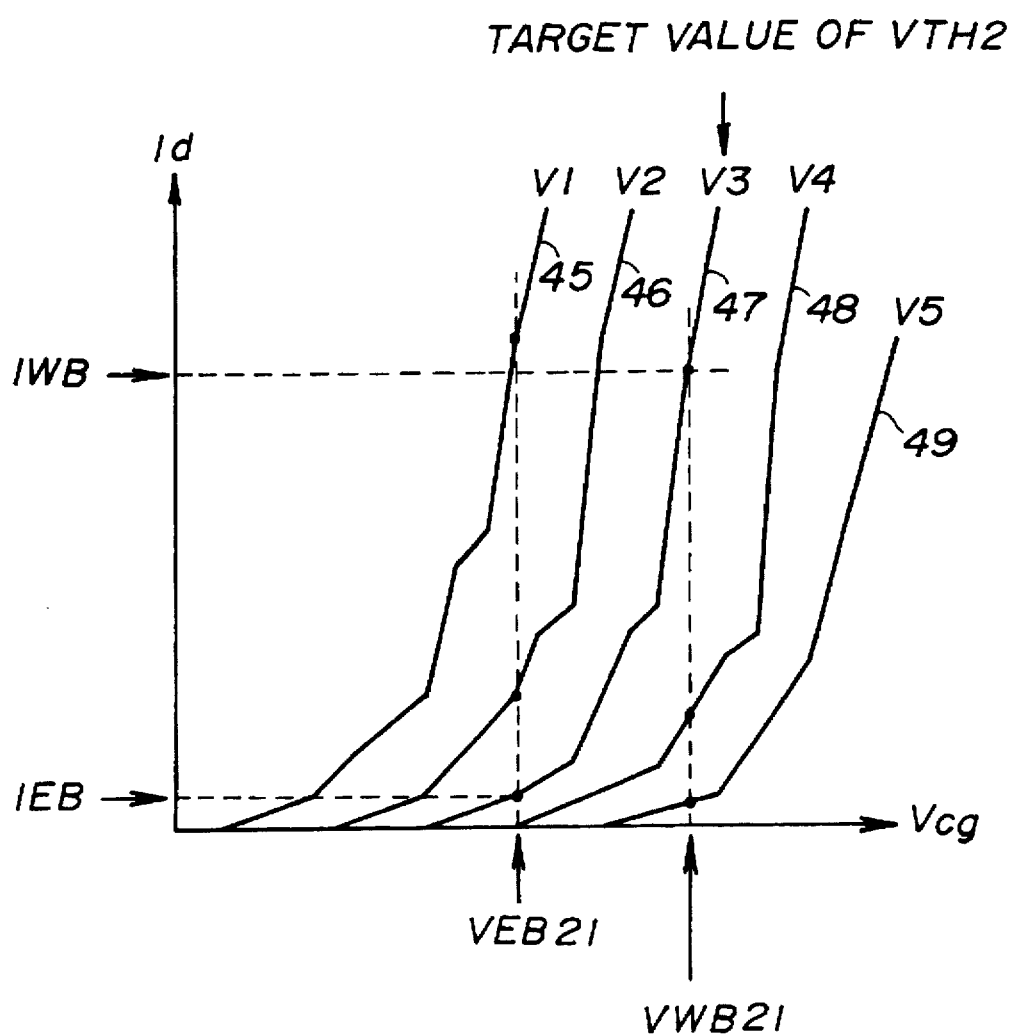
FIG. 4 is a graph of a drain current vs control gate voltage characteristic of a reference cell used in the flash memory device shown in FIG. 1.
Figure 13:
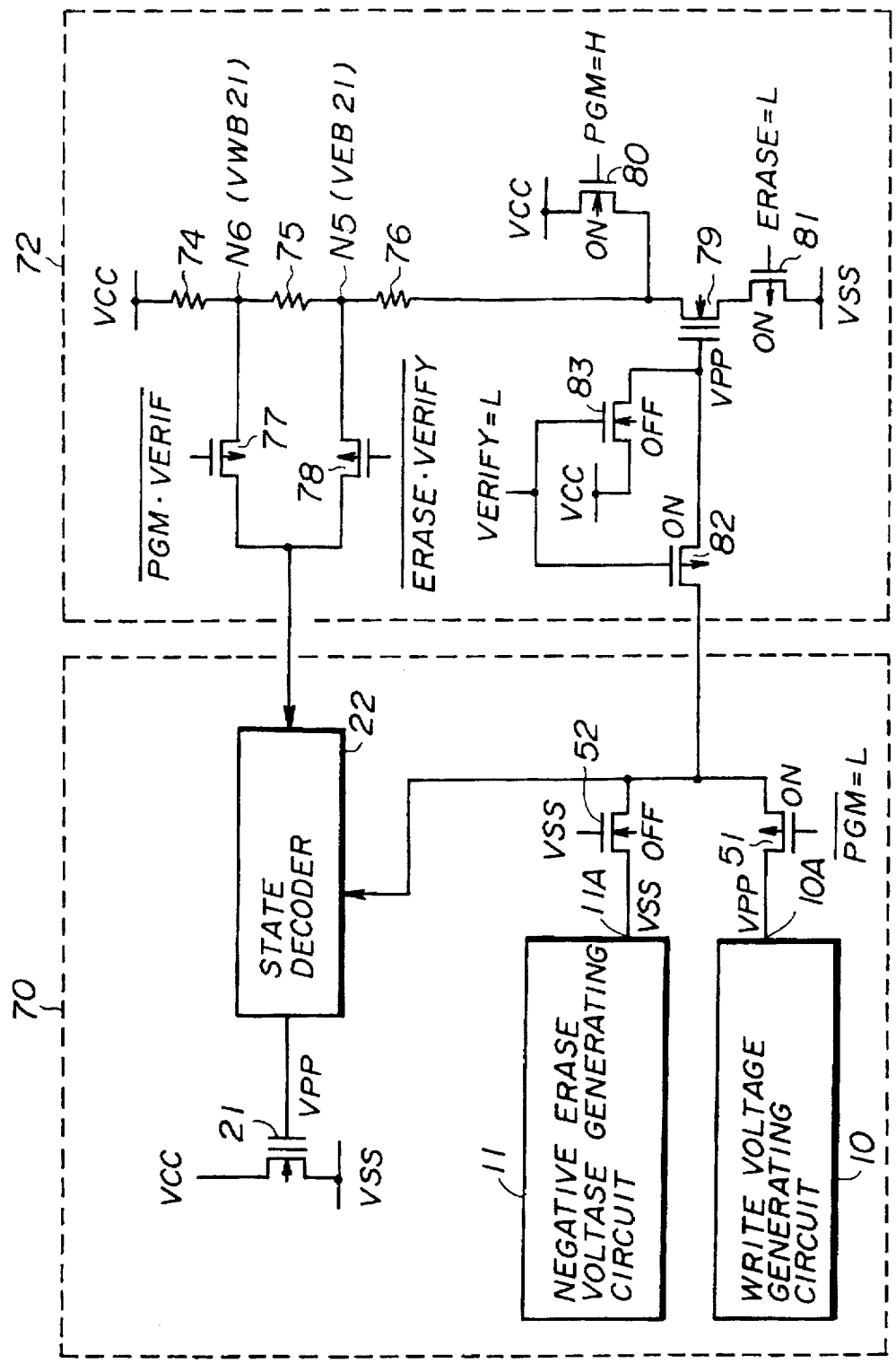
FIG. 13 is a circuit diagram for explaining the operation of the non-volatile semiconductor memory device according to the first embodiment of the present invention in which the write operation on the reference cell is carried out when the threshold voltage of the reference cell is set.

In the first embodiment of the present invention, the setting of the threshold voltage VTH21 of the reference cell 21 is carried out by performing the erase and write operations on the reference cell 21 as in the case of the conventional flash memory device shown in FIG. 1. In this case, as shown in FIGS. 11 and 13, the verify signal VERIFY is set equal to the low level, the pMOS transistor 82 is ON, and the nMOS transistor 83 is OFF.

Figure 10:
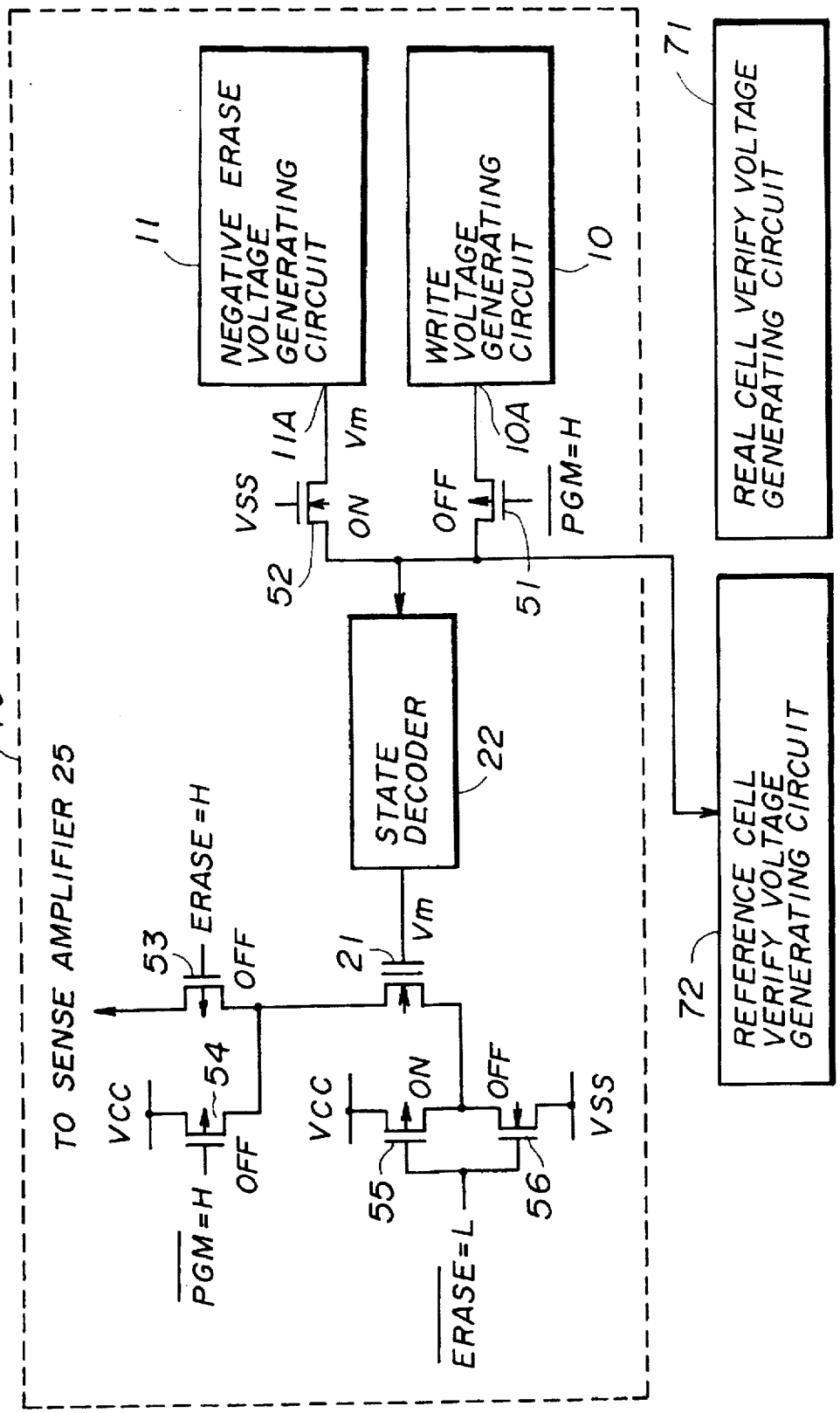
FIG. 10 is a circuit diagram for explaining the operation of the non-volatile semiconductor memory device according to the first embodiment of the present invention in which an erase operation on a reference cell is carried out when the threshold voltage of the reference cell is set.
Figure 11:
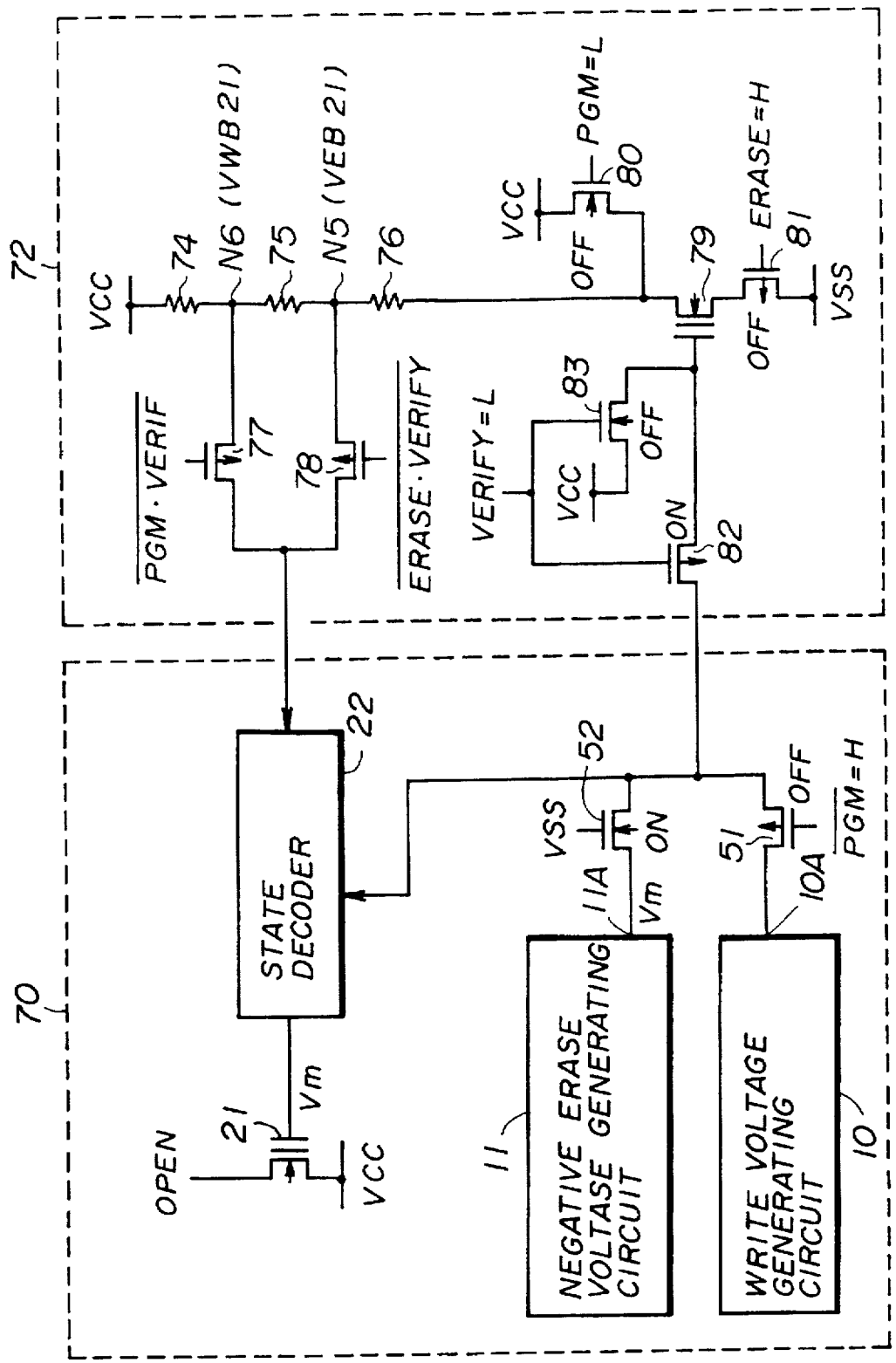
FIG. 11 is a circuit diagram for explaining the operation of the non-volatile semiconductor memory present invention in which the erase operation on the device according to the first embodiment of the reference cell is carried out when the threshold voltage of the reference cell is set.

In the erase operation, as shown in FIGS. 10 and 11, the write signal /PGM is set equal to the high level (the write signal PGM is thus set equal to the low level), and the erase signal ERASE is set equal to the high level (the erase signal /ERASE is thus set equal to the low level). The negative erase voltage generating circuit 11 outputs the negative erase voltage Vm.

Hence, the MOS transistors of the threshold voltage setting circuit 70 are set to the following states:

pMOS transistor 51 OFF
nMOS transistor 52 ON
pMOS transistor 53 OFF
pMOS transistor 54 OFF
pMOS transistor 55 ON
nMOS transistor 56 OFF.

In the reference cell verify voltage generating circuit 72, the nMOS transistor 80 is OFF and the pMOS transistor 81 is OFF. The drain of the reference cell 21 is in the open state, and the power supply voltage VCC is applied to the source thereof via the pMOS transistor 55. Further, the source of the verify voltage control cell 79 is in the open state, and the power supply voltage VCC is applied to the drain of the cell 79 via the resistors 74–76.

The negative erase voltage Vm output by the negative erase voltage generating circuit 11 is applied to the control gate of the reference cell 21 via the nMOS transistor 52 and the state decoder 22, and is applied to the control gate of the verify voltage control cell 79 via the nMOS transistor 52 and the pMOS transistor 82. Hence, in the erase operation on the reference cell 21, the erase operation on the verify voltage control cell 79 is carried out under the same voltage condition as that in the reference cell 21. In this case, the erase operation on the verify voltage control cell 79 is carried out by drawing the electrons stored in the floating gate thereof.

Figure 12:
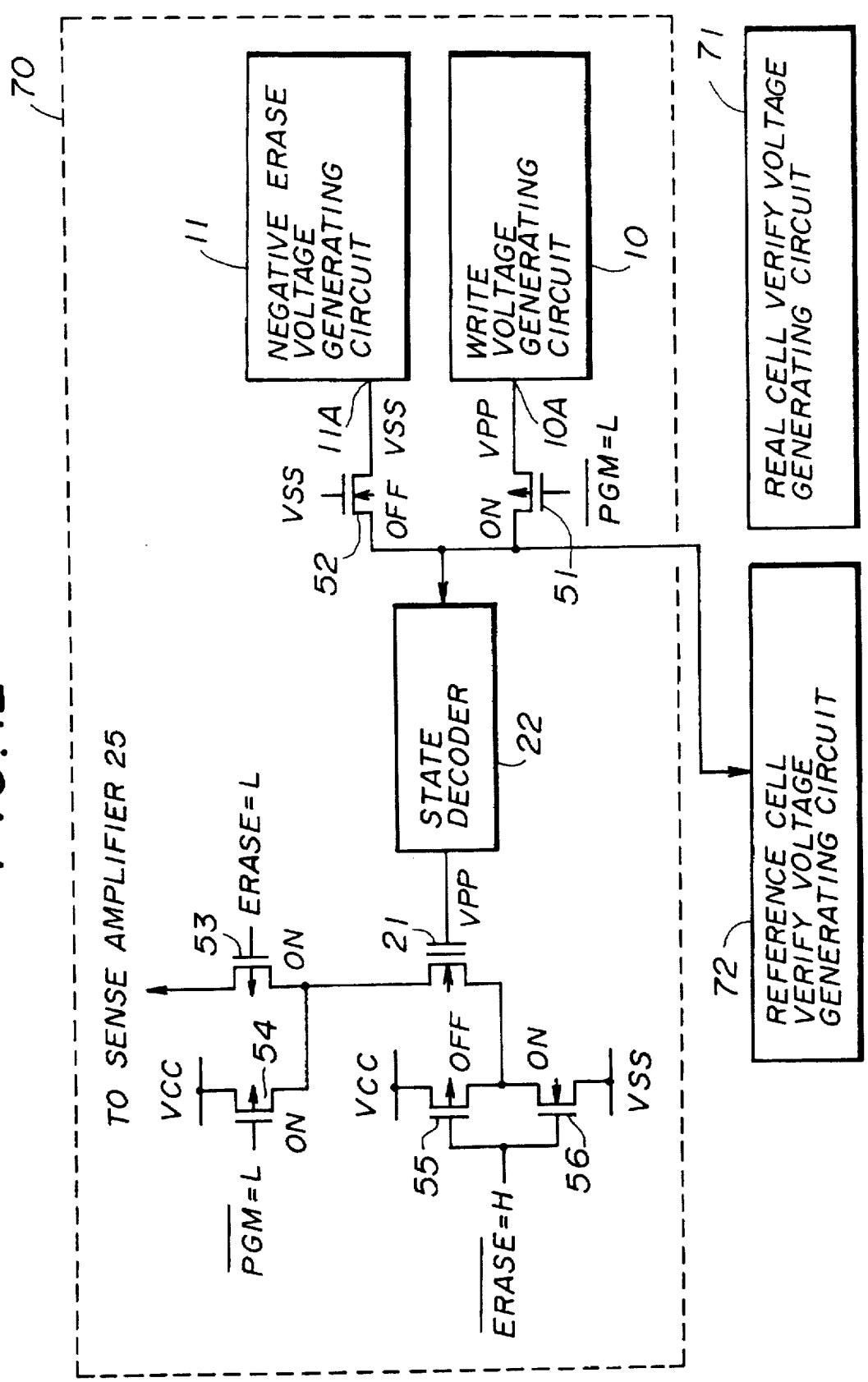
FIG. 12 is a circuit diagram for explaining the operation of the non-volatile semiconductor memory device according to the first embodiment of the present invention in which a write operation on the reference cell is carried out when the threshold voltage of the reference cell is set.

In the write operation, as shown in FIGS. 12 and 13, the write signal /PGM is set equal to the low level (the write signal PGM is thus set equal to the high level), and the erase signal ERASE is set equal to the low level (the erase signal /ERASE is thus set equal to the high level). The negative erase voltage output terminal 11A of the negative erase voltage generating circuit 11 is set to the ground voltage VSS.

Hence, the MOS transistors of the threshold voltage setting circuit 70 are set to the following states:

pMOS transistor 51 ON
nMOS transistor 52 OFF
pMOS transistor 53 ON
pMOS transistor 54 ON
pMOS transistor 55 OFF
nMOS transistor 56 ON.

In the reference cell verify voltage generating circuit 72, the nMOS transistor 80 is ON and the pMOS transistor 81 is ON. The power supply voltage VCC is applied to the drain of the reference cell 21 via the pMOS transistor 54, and the ground voltage VSS is applied to the source of the reference cell 21 via the nMOS transistor 56. The power supply voltage VCC is applied to the drain of the verify voltage control cell 79 via the nMOS transistor 80, and the ground voltage VSS is applied to the source of the cell 79 via the pMOS transistor 81.

The write voltage VPP output by the write voltage generating circuit 10 is applied to the control gate of the reference cell 21 via the pMOS transistor 51 and the state decoder 22, and is applied to the control gate of the verify voltage control cell 79 via the pMOS transistor 51 and the pMOS transistor 82. Hence, in the write operation on the reference cell 21, the write operation on the verify voltage control cell 79 is carried out under the same voltage condition as that in the reference cell 21.

Figure 14:
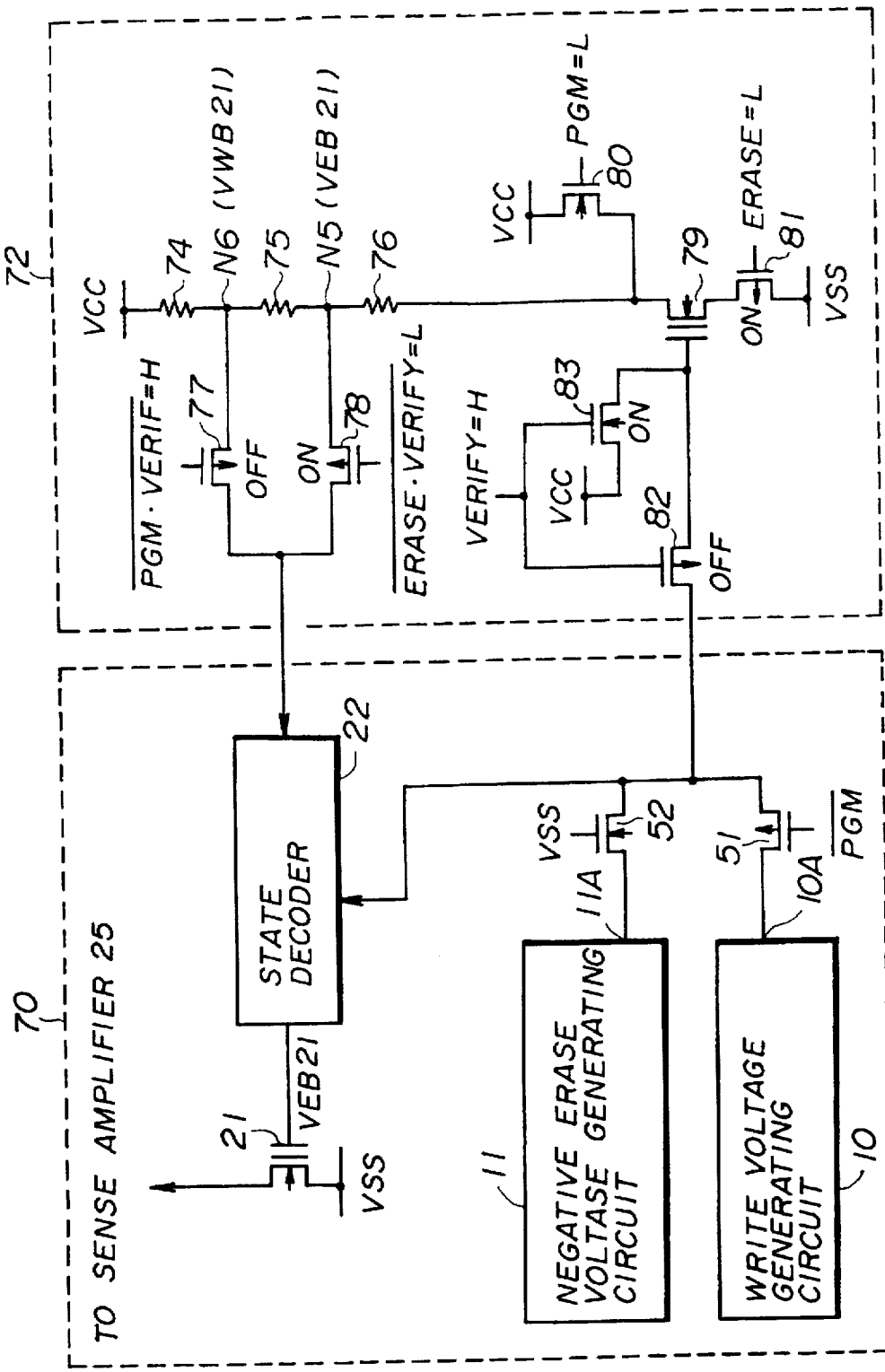
FIG. 14 is a circuit diagram for explaining the operation of the non-volatile semiconductor memory device according to the first embodiment of the present invention in which an erase verify operation on the real cell is carried out when the threshold voltage of the real cell is set.

In the erase verify operation on the real cell 20, as shown in FIG. 14, the write verify signal /PGM*VERIFY is set equal to the high level, and the erase verify signal /ERASE*VERIFY is set equal to the low level. Further, the write signal PGM is set equal to the low level, the erase signal ERASE is set equal to the low level, and the verify signal VERIFY is set equal to the high level. Hence, the MOS transistors of the reference cell verify voltage generating circuit 72 are set to the following states:

pMOS transistor 77 OFF
pMOS transistor 78 ON
nMOS transistor 80 OFF
pMOS transistor 81 ON
pMOS transistor 82 OFF
nMOS transistor 83 ON.

Hence, the power supply voltage VCC is applied to the control gate of the verify voltage control cell 79, and the ground voltage VSS is applied to the source thereof.

Hence, the erase verify voltage VEB21 for the reference cell obtained at the node N5 produced by the voltage dividing circuit made up of the resistors 74–76, the verify voltage control cell 79 and the pMOS transistor 81 is applied to the control gate of the reference cell 21 via the pMOS transistor 78 and the state decoder 22. In this case, the erase verify voltage VEB20 for the real cell assuming that the threshold voltage VTH21 of the reference cell 21 is at the target value V3 is applied to the control gate of the real cell 20, as in the case of the flash memory device shown in FIG. 1.

Figure 15:
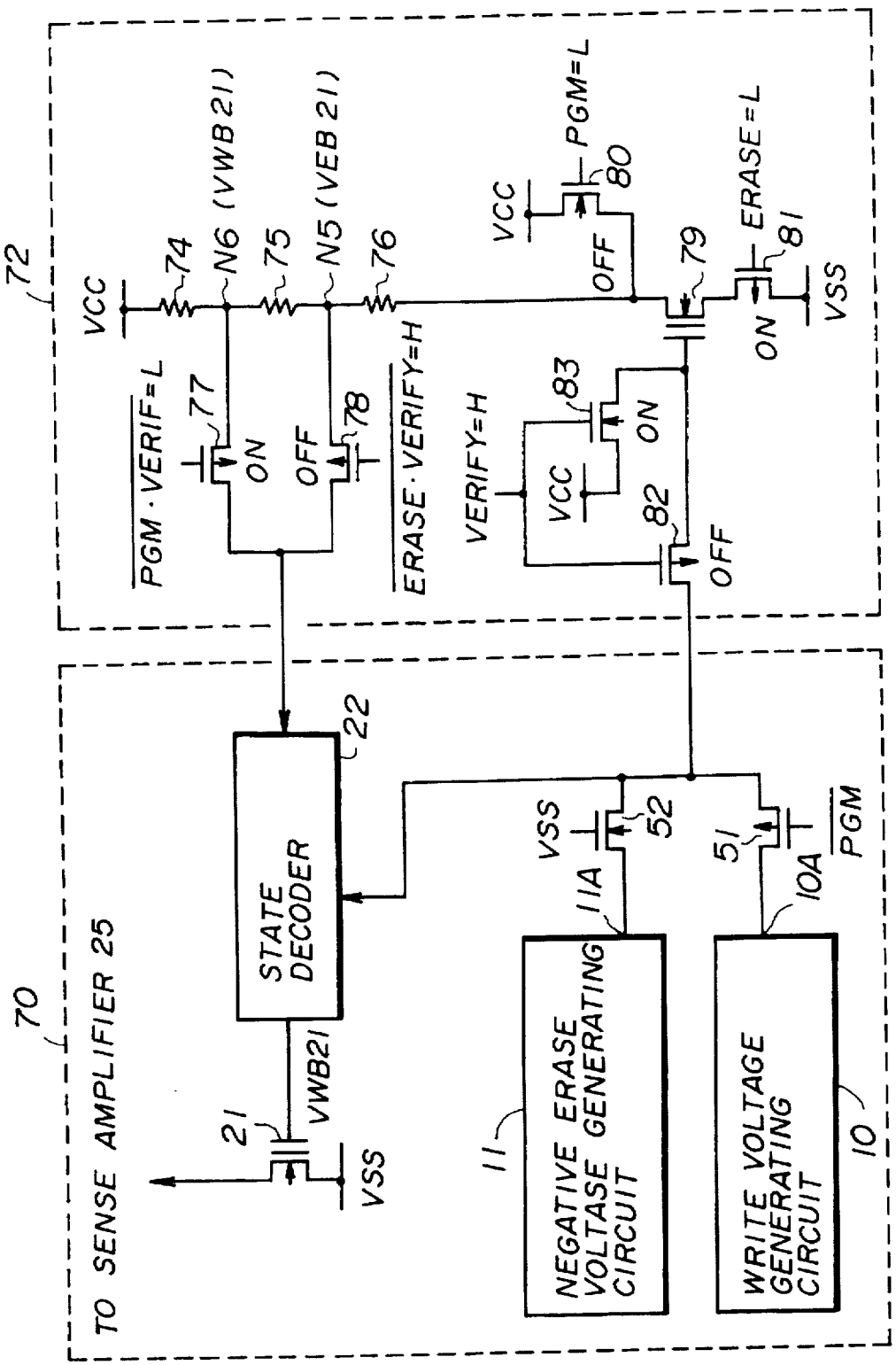
FIG. 15 is a circuit diagram for explaining the operation of the non-volatile semiconductor memory device according to the first embodiment of the present invention in which the write operation on the real cell is carried out when the threshold voltage of the real cell is set.

In the write verify operation on the real cell 20, as shown in FIG. 15, the write verify signal /PGM*VERIFY is set equal to the low level, and the erase verify signal /ERASE*VERIFY is set to the high level. Further, the write signal PGM is set equal to the low level, the erase signal ERASE is set equal to the low level, and the verify signal VERIFY is set to the high level. Hence, the MOS transistors of the reference cell verify voltage generating circuit 72 are set to the following states:

pMOS transistor 77 ON
pMOS transistor 78 OFF
nMOS transistor 80 OFF
pMOS transistor 81 ON
pMOS transistor 82 OFF
nMOS transistor 83 ON.

Hence, the power supply voltage VCC is applied to the control gate of the verify voltage control cell 79, and the ground voltage VSS is applied to the source thereof.

Hence, the write verify voltage VWB21 for the reference cell obtained at the node N6 by the voltage dividing circuit made up of the resistors 74–76, the verify voltage control cell 79 and the pMOS transistor 81 is applied to the control gate of the reference cell 21 via the pMOS transistor 77 and the state decoder 22.

In this case, the write verify voltage VWB 20 for the real cell assuming that the threshold voltage VTH21 of the reference cell 21 is at the target value V3 is applied to the control gate of the real cell 20 as in the case of the conventional flash memory device shown in FIG. 1.

As described above, according to the first embodiment of the present invention, the erase and write operations on the verify voltage control cell 79 are carried out under the same voltage condition as that in the reference cell 21, so that the threshold voltage VTH79 of the cell 79 can be set.

Hence, if the threshold value VTH21 of the reference cell 21 is at the target value V3, the threshold voltage VTH79 of the verify voltage control cell 79 is set to the target value V3, and the ON resistance of the verify voltage control cell 79 defines the target value.

If the threshold voltage VTH21 of the reference cell 21 is at a level lower than the target value V3, the threshold voltage VTH79 of the verify voltage control cell 79 is set to a level lower than the target value V3, so that the ON resistance of the verify voltage control cell 79 becomes a value smaller than the target value.

If the threshold voltage VTH21 of the reference cell 21 is at a level higher than the target value V3, the threshold voltage VTH79 of the verify voltage control cell 79 is set to a level higher than the target value V3, so that the ON resistance of the verify voltage control cell 79 becomes a value greater than the target value.

When the threshold voltage VTH21 of the reference cell 21 is set to the target value V3, the ON resistance of the verify voltage control cell 79 is equal to the target value V3. Hence, in the verify operation, the erase verify voltage VEB21 for the reference cell obtained at the node N5 and the write verify voltage VWB21 for the reference cell obtained at the node N6 can be set equal to respective voltage values needed when the threshold voltage VTH21 of the reference cell 21 is set to the target value V3.

If the threshold voltage VTH21 of the reference cell 21 is set to a level lower than the target value V3, the ON resistance of the verify voltage control cell 79 becomes smaller than the target value. In the verify operation, the erase verify voltage VEB21 for the reference cell obtained at the node N5 and the write verify voltage VWB21 for the reference cell obtained at the node N6 can be set to respective voltage levels lower than the target level so that the above respective voltage levels reflect the actual level of the threshold voltage VTH21 of the reference cell 21 and enable the verify operation.

If the threshold voltage VTH21 of the reference cell 21 is set to a level higher than the target value V3, the ON resistance of the verify voltage control cell 79 becomes greater than the target value. In the verify operation, the erase verify voltage VEB21 for the reference cell obtained at the node N5 and the write verify voltage VWB21 for the reference cell obtained at the node N6 can be set to the respective voltage levels higher than the target level so that the above respective voltage levels reflect the actual level of the threshold voltage VTH21 of the reference cell 21 and enable the verify operation.

As described above, according to the first embodiment of the present invention, in the erase verify operation, the erase verify voltage VEB20 for the real cell 20 assuming that the threshold voltage VTH21 of the reference cell 21 is equal to the target value V3, is applied to the control gate of the real cell 20. In the write verify operation, the write verify voltage VWB20 for the real cell 20 assuming that the threshold voltage VTH21 of the reference cell 21 is equal to the target value V3, is applied to the control gate of the real cell 20.

In the erase verify operation, the control gate of the reference cell 21 is supplied with the erase verify voltage VEB21 for the reference cell 21 which reflects the actual value of the threshold voltage VTH21 of the reference cell 21 to enable the erase verify operation. In the write verify operation, the control gate of the reference cell 21 is supplied with the write verify voltage VWB21 which reflects the actual voltage of the threshold voltage VTH21 of the reference cell 21 to enable the write verify operation.

That is, in the erase verify operation, the control gates of the real cell 20 and the reference cell 21 are respectively supplied with the erase verify voltages VEB20 and VEB21 which correspond to the real value of the threshold voltage VTH21 of the reference cell 21. In the write verify operation, the control gates of the real cell 20 and the reference cell 21 are respectively supplied with the write verify voltages VWB20 and VWB21 which correspond to the real value of the threshold voltage VTH21 of the reference cell 21.

Figure 16:
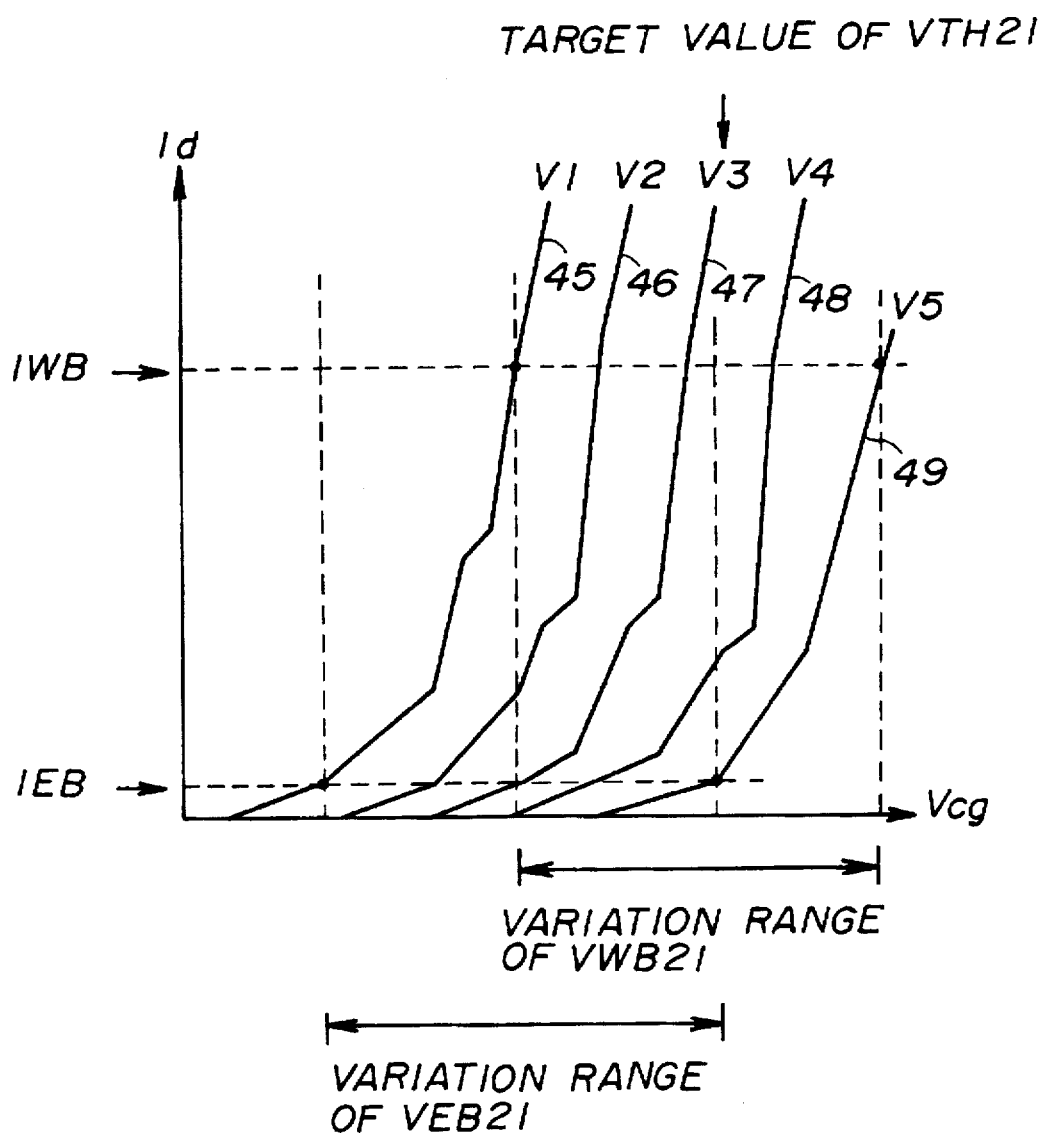
FIG. 16 is a graph of drain current vs control gate voltage of the reference cell.

Hence, as shown in FIG. 16, even if the threshold voltage VTH21 of the reference cell 21 deviates from the target value V3, the erase verify voltage VEB21 for the reference cell and the write verify voltage VWB21 for the reference cell are made to shift in accordance with the threshold voltage VTH21 of the reference cell 21, so that the voltages VEB21 and VWB21 can be set to the voltage levels which enable the erase verify and write verify operations.

According to the first embodiment of the present invention, even if the threshold voltage VTH21 of the reference cell 21 deviates from the target value V3, the erase verify and write verify operations can be carried out.

A description will now be given of a second embodiment of the present invention.

Figure 17:
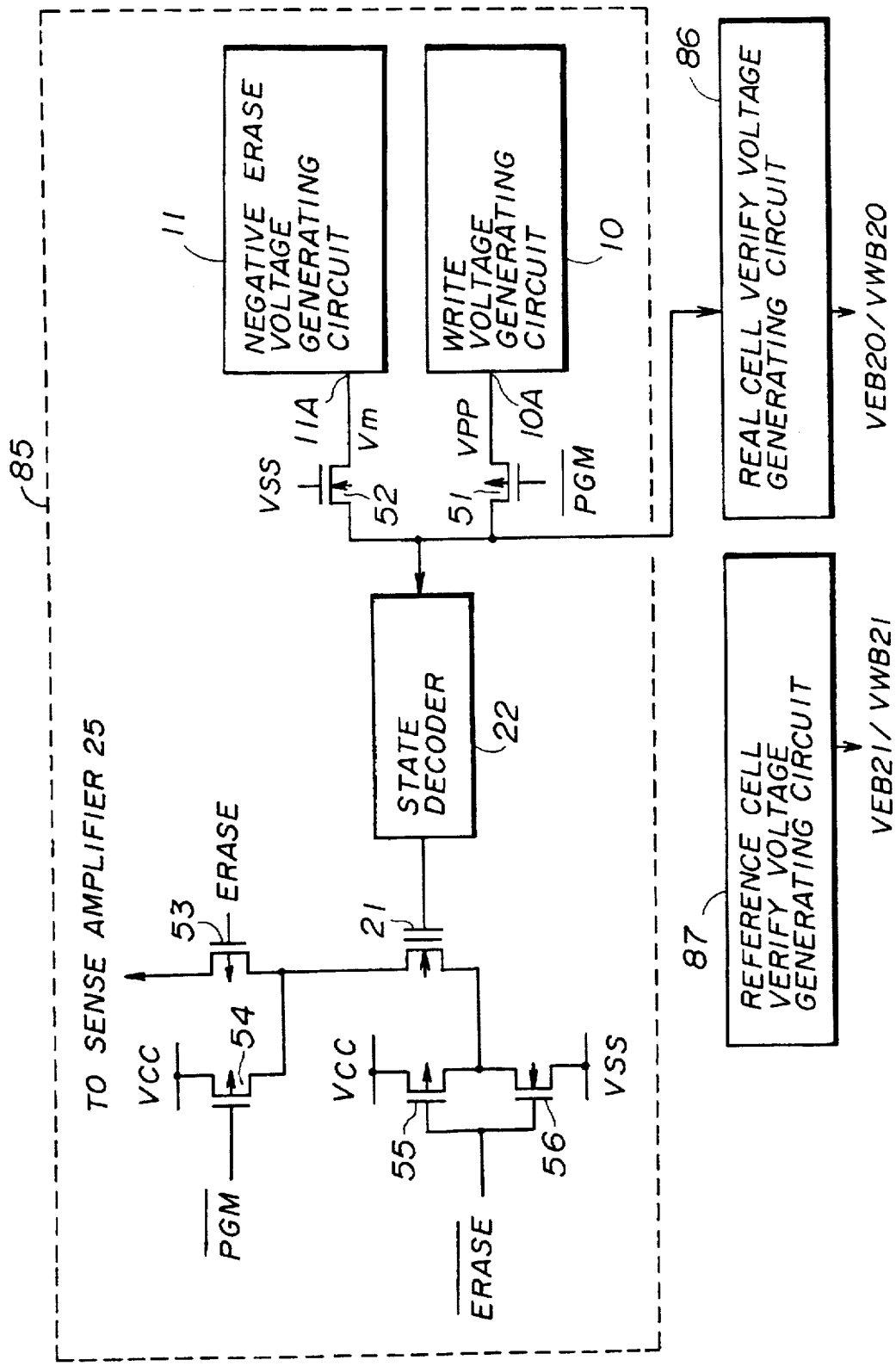
FIG. 17 is a circuit diagram of part of a non-volatile semiconductor memory device according to a second embodiment of the present invention.

FIG. 17 is a circuit diagram of a part of a non-volatile semiconductor memory device according to the second embodiment of the present invention. The configuration shown in FIG. 17 includes a threshold voltage setting circuit 85 for setting the threshold voltage VTH21 of the reference cell 21. In FIG. 17, there are illustrated a real cell verify voltage generating circuit 86, which generates a verify voltage for the real cells, and a reference cell verify voltage generating circuit 87, which generates a verify voltage for the reference cells.

The reference cell verify voltage generating circuit 87 is configured in the same manner as the reference cell verify voltage generating circuit shown in FIG. 7 provided in the conventional flash memory device shown in FIG. 1.

According to the second embodiment of the present invention, the threshold voltage setting circuit shown in FIG. 5 and the real cell verify voltage generating circuit shown in FIG. 6 are replaced by the threshold voltage setting circuit 85 and real cell verify voltage generating circuit 86 respectively having configurations different from those of the circuits shown in FIGS. 5 and 6. The other parts of the second embodiment of the present invention are the same as those of the conventional flash memory device shown in FIG. 1.

A verify voltage supply circuit can be defined so that it is made up of the real cell verify voltage generating circuit 86, the X decoder 3, the reference cell verify voltage generating circuit 87 and the state decoder 22.

Another verify voltage supply circuit can be defined so that it is made up of the real cell verify voltage generating circuit 86, and the X decoder 3.

Yet another verify voltage supply circuit can be defined so that it is made up of the reference cell verify voltage generating circuit 87 and the state decoder 22.

The threshold voltage setting circuit 85 is configured in the same manner as the threshold voltage setting circuit shown in FIG. 5 except that the negative erase voltage Vm output by the negative erase voltage generating circuit 11 and the write voltage VPP output by the write voltage generating circuit 10 are selectively supplied to the real cell verify voltage generating circuit 86.

Figure 18:
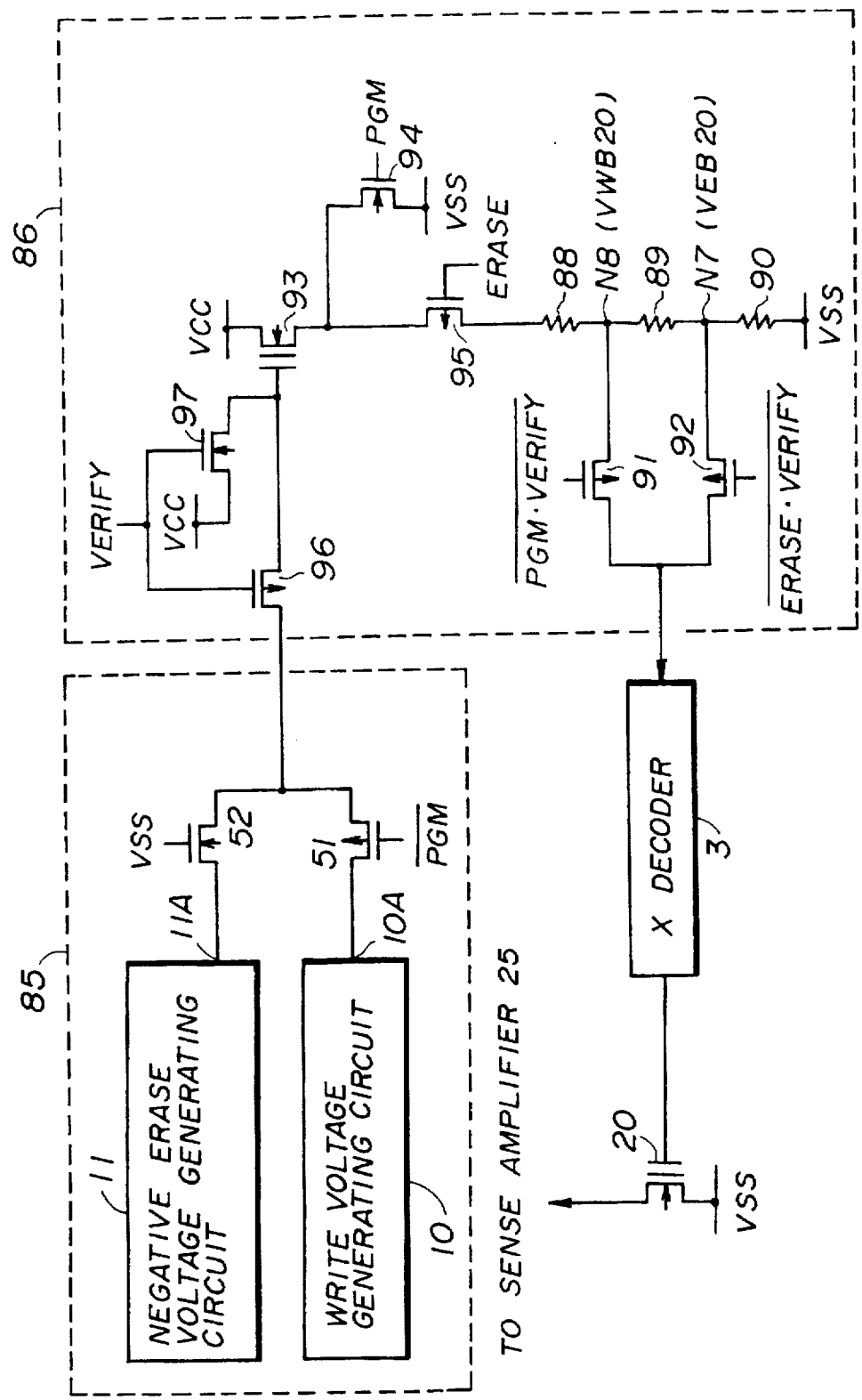
FIG. 18 a circuit diagram of a part of a non-volatile semiconductor memory device according to the second embodiment of the present invention.

The real cell verify voltage generating circuit 86 is configured as shown in FIG. 18. The circuit 86 includes resistors 88, 89 and 90, and pMOS transistors 91 and 92. The pMOS transistor 91 is turned ON/OFF by the write verify signal /PGM*VERIFY, and the pMOS transistor 92 is turned ON/OFF by the erase verify signal /ERASE*VERIFY.

A verify voltage control cell 93 has the same structure as the reference cell 21. An nMOS transistor 94 is turned ON/OFF by the write signal PGM. A pMOS transistor 95 is turned ON/OFF by the erase signal ERASE. A pMOS transistor 96 is turned ON/OFF by the verify signal VERIFY. An nMOS transistor 97 is turned ON/OFF by the verify signal VERIFY.

The erase verify voltage VEB20 for the real cell is available at node N7 of the real cell verify voltage generating circuit 86. The write verify voltage VWB20 for the real cell is available at node N8.

A verify voltage generating circuit can be defined so that it is made up of the verify voltage control cell 93, the pMOS transistor 95, and the resistors 88, 89 and 90. Another verify voltage supply circuit can be defined so that it is made up of the pMOS transistors 91 and 92 and the state decoder 22.

Figure 22:
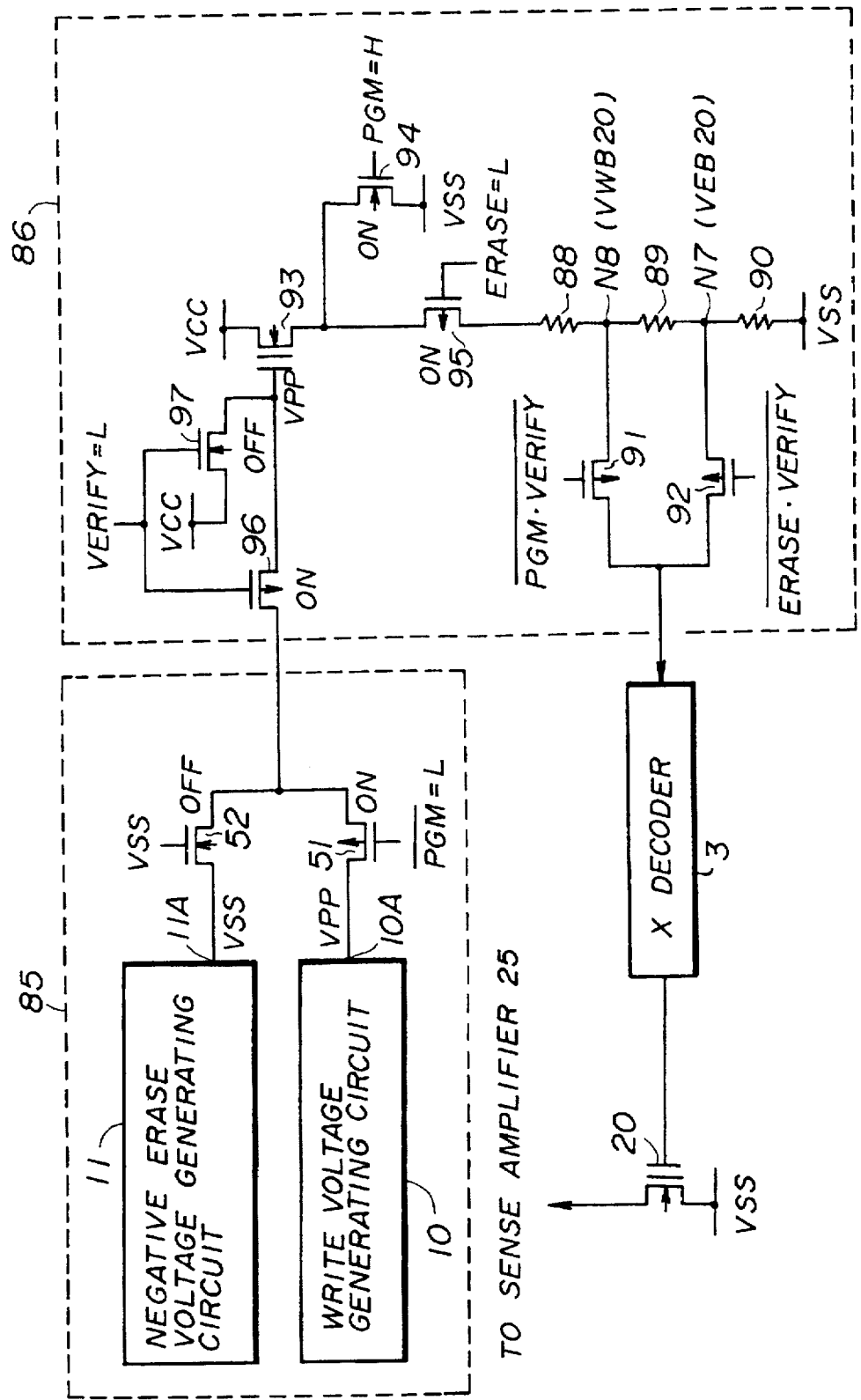
FIG. 22 is a circuit diagram for explaining the operation of the non-volatile semiconductor memory device according to the second embodiment of the present invention in which the write operation on the reference cell is carried out when the threshold voltage of the reference cell is set.

According to the second embodiment of the present invention, the setting of the threshold voltage VTH21 of the reference cell 21 can be carried out by performing the erase and write operations on the reference cell 21 as in the case of the flash memory device shown in FIG. 1. In this case, as shown in FIGS. 20 and 22, the verify signal VERIFY is set to the low level, the pMOS transistor 96 is ON and the nMOS transistor 97 is OFF.

Figure 19:
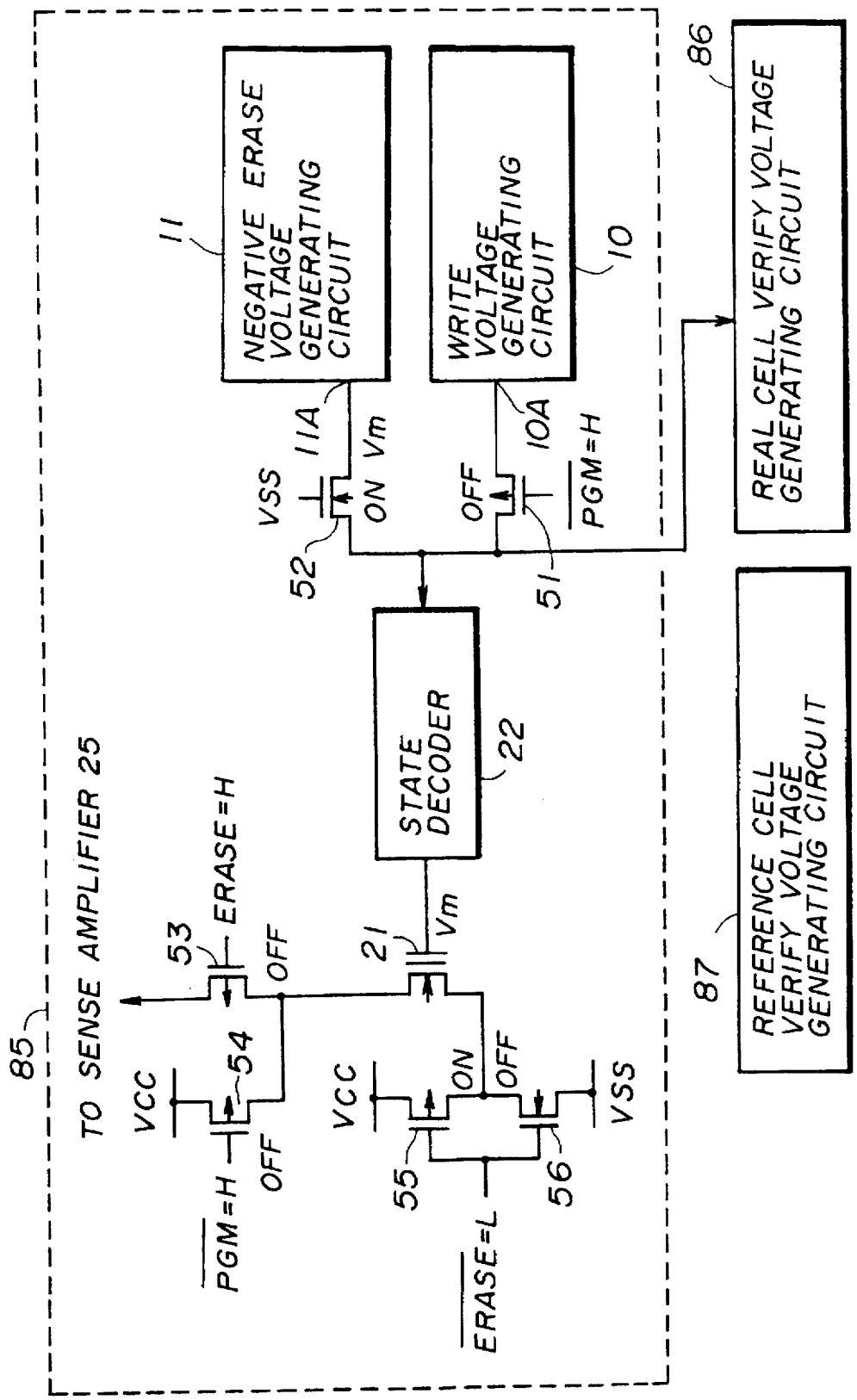
FIG. 19 is a circuit diagram for explaining the operation of the non-volatile semiconductor memory device according to the second embodiment of the present invention in which an erase operation on a reference cell is carried out when the threshold voltage of the reference cell is set.
Figure 20:
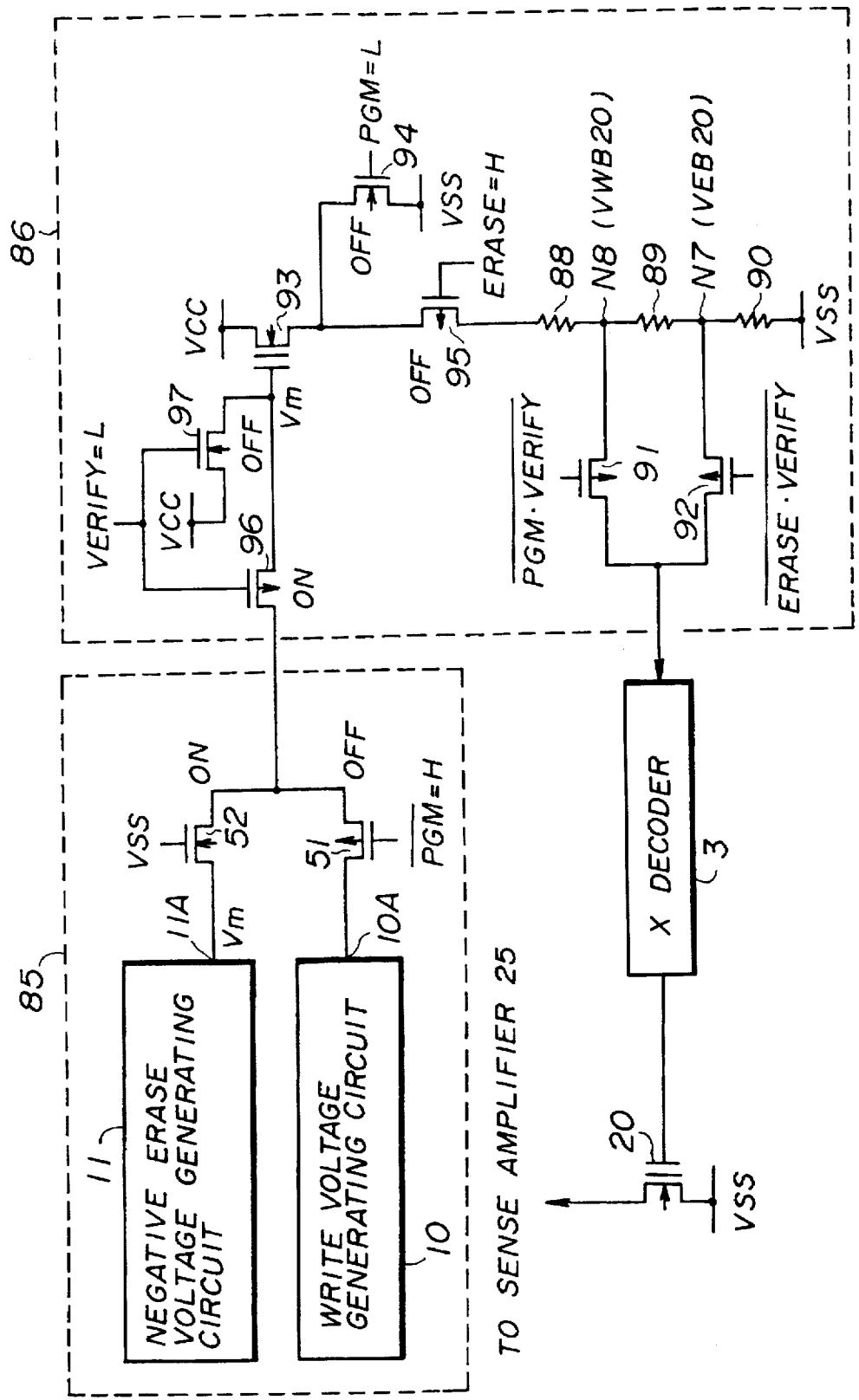
FIG. 20 is a circuit diagram for explaining the operation of the non-volatile semiconductor memory device according to the second embodiment of the present invention in which the erase operation on the reference cell is carried out when the threshold voltage of the reference cell is set.

In the erase operation, as shown in FIGS. 19 and 20, the write signal /PGM is set to the high level (the write signal PGM is thus set to the low level), and the erase signal ERASE is set to the high level (the erase signal /ERASE is thus set to the low level). The negative erase voltage Vm is output by the negative erase voltage generating circuit 11.

Hence, the MOS transistors of the threshold voltage setting circuit 85 are set to the following states:

pMOS transistor 51 OFF
nMOS transistor 52 ON
pMOS transistor 53 OFF
pMOS transistor 54 OFF
pMOS transistor 55 ON
nMOS transistor 56 OFF.

The nMOS transistor 94 and the pMOS transistor 95 of the real cell verify voltage generating circuit 86 are respectively OFF. The drain of the reference cell 21 is made to be in the open state, and the source thereof is supplied with the power supply voltage VCC via the pMOS transistor 55. The source of the verify voltage control cell 93 is made to be in the open state, and the drain thereof is supplied with the power supply voltage VCC.

The negative erase voltage Vm output by the negative erase voltage generating circuit 11 is applied to the control gate of the reference cell 21 via the nMOS transistor 52 and the state decoder 22, and is applied to the control gate of the verify voltage control cell 93 via the nMOS transistor 52 and the pMOS transistor 96.

Hence, when the erase operation on the reference cell 21 is carried out, the erase operation on the verify voltage control cell 93 is carried out under the same condition as that for the reference cell 21. In this case, the erase operation on the verify voltage control cell 93 is carried out by drawing the electrons stored in the floating gate thereof.

Figure 21:
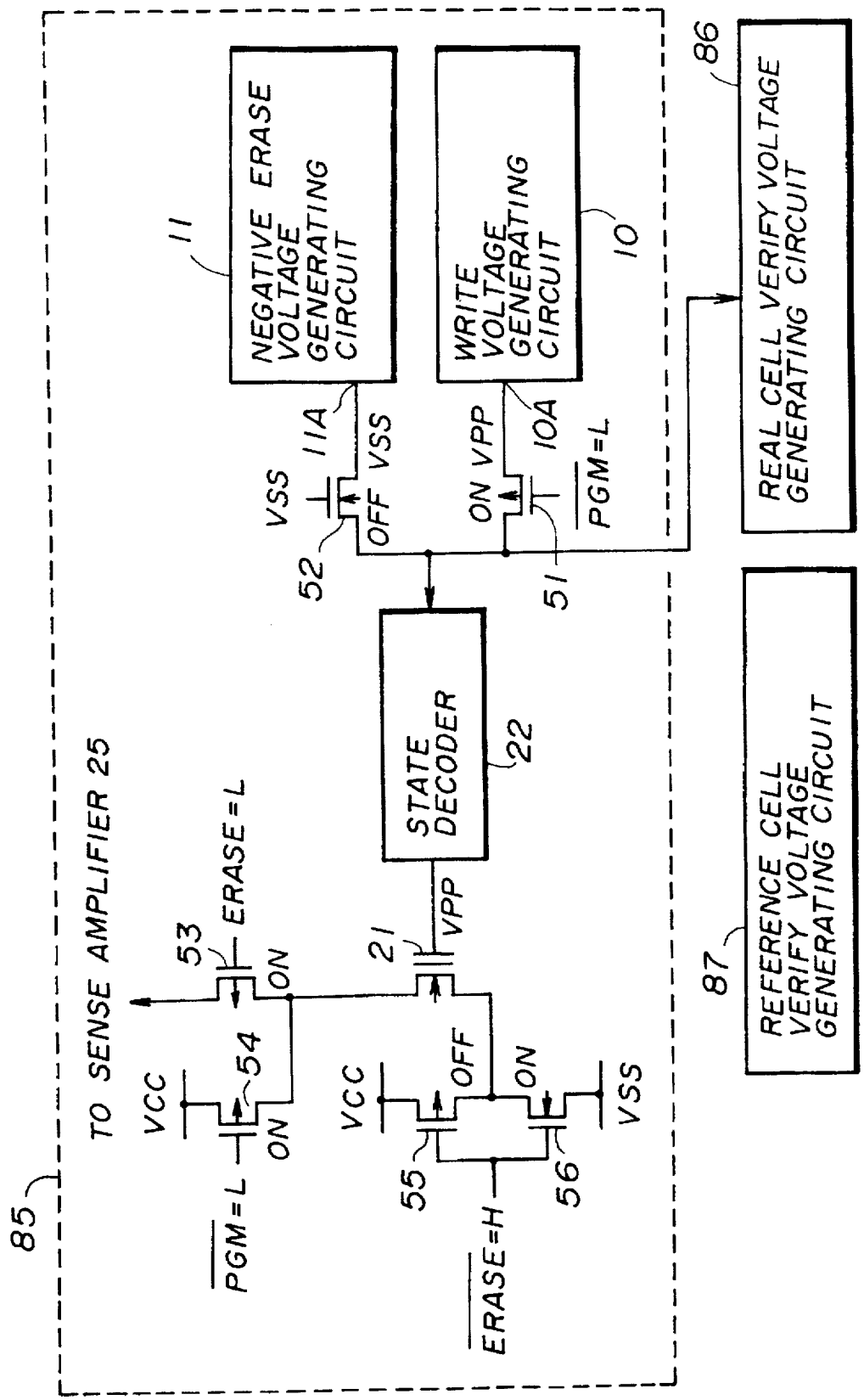
FIG. 21 is a circuit diagram for explaining the operation of the non-volatile semiconductor memory device according to the second embodiment of the present invention in which a write operation on the reference cell is carried out when the threshold voltage of the reference cell is set.

In the write operation, as shown in FIGS. 21 and 22, the write signal /PGM is set to the low level (the write signal PGM is thus set to the high level), and the erase signal ERASE is set to the low level (the erase signal /ERASE is thus set to the high level). The negative erase voltage output terminal 11A of the negative erase voltage generating circuit is set to the ground voltage VSS.

Hence, the MOS transistors of the threshold voltage setting circuit 85 are set to the following states:

pMOS transistor 51 ON
nMOS transistor 52 OFF
pMOS transistor 53 ON
pMOS transistor 54 ON
pMOS transistor 55 OFF
nMOS transistor 56 ON.

The nMOS transistor 94 and the pMOS transistor 95 of the real cell verify voltage generating circuit 86 are both ON. The drain of the reference cell 21 is supplied with the power supply voltage VCC via the pMOS transistor 54, and the source thereof is supplied with the ground voltage VSS via the nMOS transistor 56. The drain of the verify voltage control cell 93 is supplied with the power supply voltage VCC, and the source thereof is supplied with the ground voltage VSS.

The write voltage VPP output by the write voltage generating circuit 10 is applied to the control gate of the reference cell 21 via the pMOS transistor 51 and the state decoder 22, and is applied to the control gate of the verify voltage control cell 93 via the pMOS transistor 51 and the pMOS transistor 96. Hence, when the write operation on the reference cell 21 is carried out, the write operation on the verify voltage control cell 93 is carried out under the same condition as that for the reference cell 21.

Figure 23:
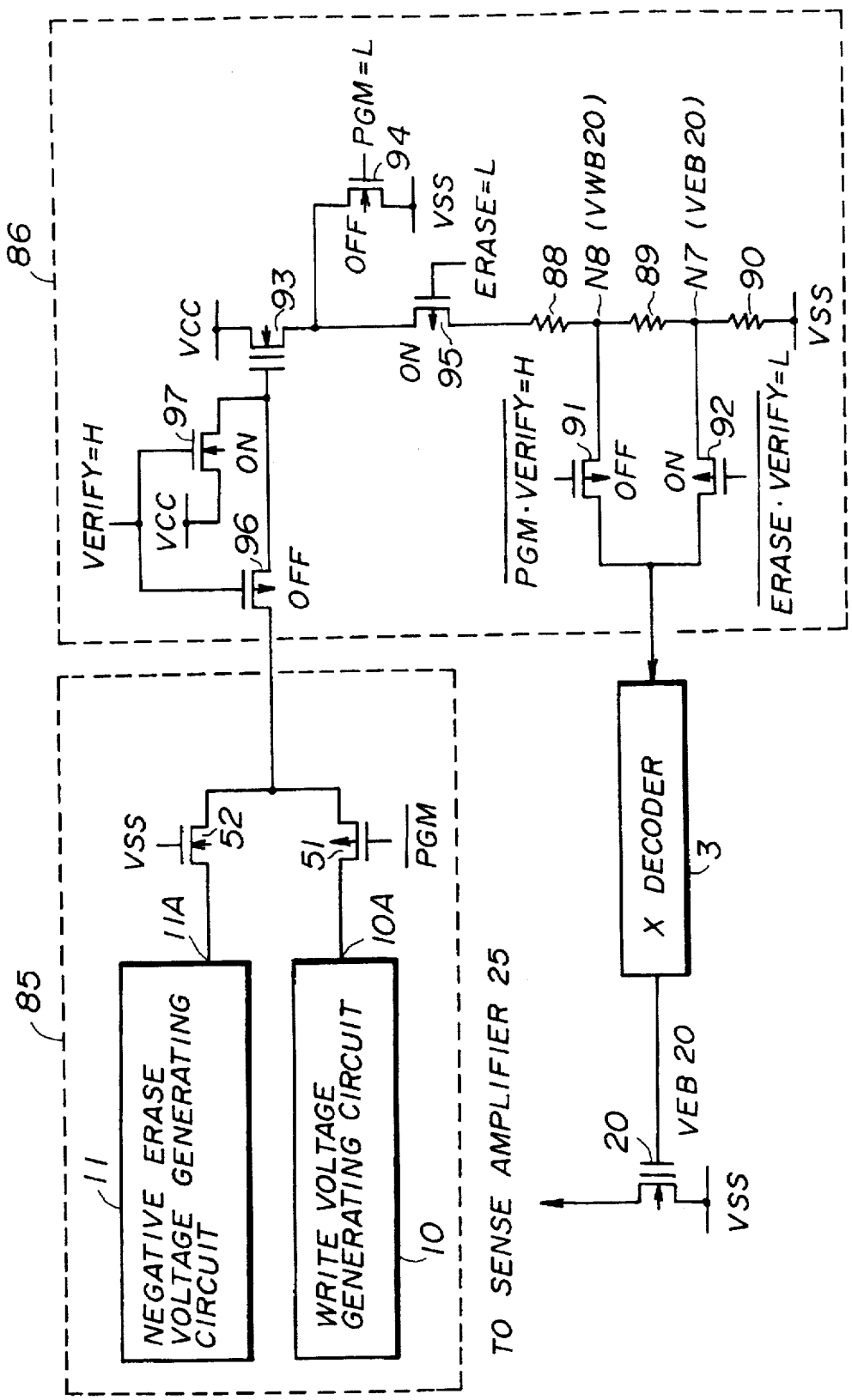
FIG. 23 is a circuit diagram for explaining the operation of the non-volatile semiconductor memory device according to the second embodiment of the present invention in which an erase verify operation on the real cell is carried out when the threshold voltage of the real cell is set.

In the erase verify operation on the real cell 20, as shown in FIG. 23, the write verify signal /PGM*VERIFY is set to the high level, and the erase verify signal /ERASE*VERIFY is set to the low level. Further, the write signal PGM is set to the low level, the erase signal ERASE is set to the low level, and the verify signal VERIFY is set to the high level.

Hence, the MOS transistors of the real cell verify voltage generating circuit 86 are set to the following states:

pMOS transistor 91 OFF
pMOS transistor 92 ON
nMOS transistor 94 OFF
pMOS transistor 95 ON
pMOS transistor 96 OFF
nMOS transistor 97 ON.

The power supply voltage VCC is applied to the control gate of the verify voltage control cell 93.

Hence, the control gate of the real cell 20 is supplied with the real cell erase verify voltage VEB20 obtained at the node N7 by the voltage dividing circuit made up of the verify voltage control cell 93, the pMOS transistor 95 and the resistors 88, 89 and 90. In this case, the control gate of the reference cell 21 is supplied with the reference cell erase verify voltage VEB21 assuming that the threshold voltage VTH21 of the reference cell 21 is equal to the target value V3, as in the case of the flash memory device shown in FIG. 1.

Figure 24:
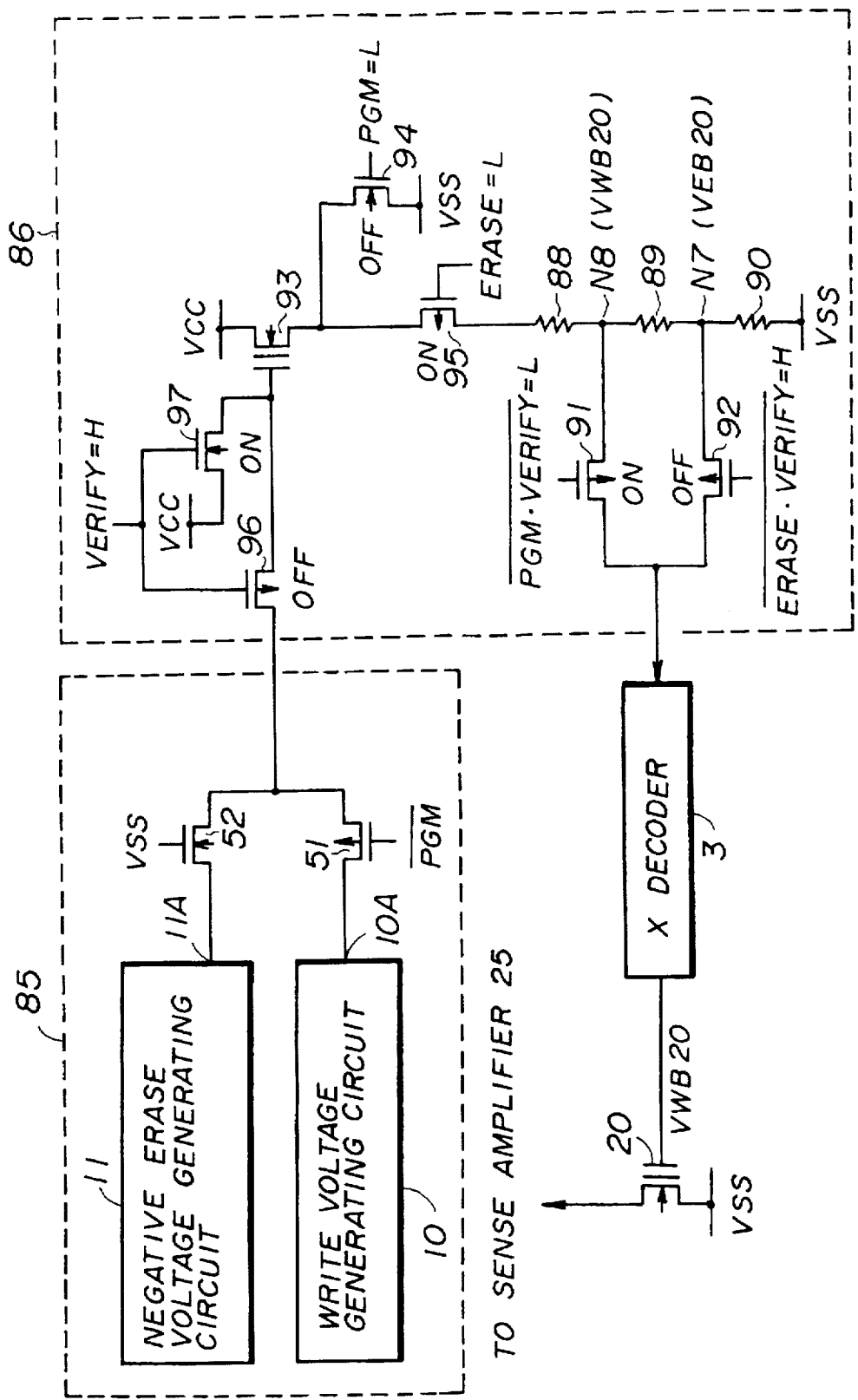
FIG. 24 is a circuit diagram for explaining the operation of the non-volatile semiconductor memory device according to the second embodiment of the present invention in which the write operation on the real cell is carried out when the threshold voltage of the real cell is set.

In the write verify operation on the real cell 20, as shown in FIG. 24, the erase verify signal /ERASE*VERIFY is set to the high level, and the write verify signal /PGM*VERIFY is set to the low level. Further, the write signal PGM is set to the low level, and the erase signal ERASE is set to the low level. Furthermore, the verify signal VERIFY is set to the high level.

Hence, the MOS transistors of the real cell verify voltage generating circuit 86 are set to the following states:

pMOS transistor 91 ON
pMOS transistor 92 OFF
nMOS transistor 94 OFF
pMOS transistor 95 ON
pMOS transistor 96 OFF
nMOS transistor 97 ON.

Hence, the power supply voltage VCC is applied to the control gate of the verify voltage control cell 93. Hence, the control gate of the real cell 20 is supplied via the X decoder 3 with the real cell write verify voltage VWB20 obtained at the node N8 by the voltage dividing circuit made up of the verify voltage control cell 93, the pMOS transistor 95 and the resistors 88, 89 and 90.

In this case, the control gate of the reference cell 21 is supplied with the reference cell write verify voltage VEB21 assuming that the threshold voltage VTH21 of the reference cell 21 is equal to the target value V3.

According to the second embodiment of the present invention, the erase and write operations on the verify voltage control cell 93 are carried out under the same condition as that for the reference cell 21, so that the threshold voltage VTH93 is set. Hence, when the threshold voltage VTH21 of the reference cell 21 is set to the target value V3, the threshold voltage VTH93 of the verify voltage control cell 93 is also set to the target value, so that the ON resistance of the verify voltage control cell 93 defines the target value.

If the threshold voltage VTH21 of the reference cell 21 is set to a level lower than the target value V3, the threshold voltage VTH93 of the verify voltage control cell 93 is also set to a level lower than the target value, so that the ON resistance of the verify voltage control cell 93 becomes a value smaller than the target value.

If the threshold voltage VTH21 of the reference cell 21 is set to a level higher than the target value, the threshold voltage VTH93 of the verify voltage control cell 93 is also set to a level higher than the target value, so that the ON resistance of the verify voltage control cell 93 becomes a value greater than the target value.

When the threshold value VTH21 of the reference cell 21 is set to the target value V3, the ON resistance of the verify voltage control cell 93 is equal to the target value. Hence, in the verify operation, the real cell erase verify voltage VEB20 obtained at the node N7 and the real cell write verify voltage VWB20 obtained at the node N8 can be set equal to voltage values needed when the threshold voltage VTH21 of the reference cell 21 is set to the target value V3.

If the threshold voltage VTH21 of the reference cell 21 is set to a level lower than the target value V3, the ON resistance of the verify voltage control cell 93 becomes smaller than the target value. Hence, in the verify operation, the real cell erase verify voltage VEB20 obtained at the node N7 and the real cell write verify voltage VWB20 obtained at the node N8 can be set to voltage values higher than the target value, so that the voltages VEB20 and VWB20 can be set to verify-enabling voltage values that reflect the real value of the threshold voltage VTH21 of the reference cell 21.

If the threshold voltage VTH21 of the reference cell 21 is set to a level higher than the target value, the ON resistance of the verify voltage control cell 93 becomes greater than the target value. Hence, in the verify operation, the reference cell erase verify voltage VEB21 obtained at the node N7 and the reference cell write verify voltage VWB21 obtained at the node N8 can be set to voltage values lower than the target value, so that the voltages VEB21 and VWB21 can be set to verify-enabling voltage values that reflect the real value of the threshold voltage VTH21 of the reference cell 21.

According to the second embodiment of the present invention, in the erase verify operation, the control gate of the reference cell 21 is supplied with the reference cell erase verify voltage VEB21 assuming that the threshold voltage VTH21 of the reference cell 21 is equal to the target value V3. In the write verify operation, the control gate of the reference cell 21 is supplied with the reference cell write verify voltage VWB21 assuming that the threshold voltage VTH21 of the reference cell 21 is equal to the target value V3.

In the erase verify operation, the control gate of the real cell 20 is supplied with the real cell erase verify voltage VEB20 which reflects the actual value of the threshold voltage VTH21 of the reference cell 21 to thereby enable the erase verify operation. In the write verify operation, the control gate of the real cell 20 is supplied with the real cell write verify voltage VWB20 which reflects the actual value of the threshold voltage VTH21 of the reference cell 21 to thereby enable the write verify operation.

That is, in the erase verify operation, the control gates of the real cell 20 and the reference cell 21 are supplied with the erase verify voltages VEB20 and VEB21 which correspond to the actual value of the threshold voltage VTH21 of the reference cell 21. In the write verify operation, the control gates of the real cell 20 and the reference cell 21 are supplied with the write verify voltages VWB20 and VWB21 that correspond to the actual value of the threshold voltage VTH21 of the reference cell 21.

Hence, according to the second embodiment of the present invention, the erase and write verify operation can duly be performed even if the threshold voltage VTH21 of the reference cell 21 deviates from the target value V3.

The present invention is not limited to the specifically disclosed embodiments, and variations and modifications may be made without departing from the scope of the present invention.

What is claimed is:

1. A non-volatile semiconductor memory device comprising:

a first memory cell which is electrically erasable and programmable and stores data;

a second memory cell which is electrically erasable and programmable and has a threshold voltage which is set by performing erase and write operations on the second memory separately from erase and write operations on the first memory;

a sense amplifier comparing currents respectively flowing in the first and second memory cells to sense a state of the first memory cell; and a verify voltage supply circuit which supplies, in an erase verify operation, control gates of the first and second memory cells with erase verify voltages dependent on an actual value of the threshold voltage of the second memory cell, and supplies, in a write verify operation, the control gates of the first and second memory cells with write verify voltages dependent on an actual value of the threshold voltage of the second memory cell, whereby the erase and write verify operations can duly be carried out even if the threshold voltage of the second memory cell actually derives from a target value.

2. The non-volatile semiconductor memory device as claimed in claim 1, wherein said verify voltage supply circuit comprises:

a first part which supplies, in the erase verify operation, the control gate of the first memory cell with a first erase verify voltage assuming that the threshold voltage of the second memory cell is equal to the target value, and supplies, in the write verify operation, the control gate of the second memory cell with a first write verify voltage assuming that the threshold voltage of the second memory cell is equal to the target value; and a second part which supplies, in the erase verify operation, the control gate of the second memory cell with a second erase verify voltage which reflects the actual value of the threshold voltage of the second memory cell, and supplies, in the write verify operation, the control gate of the second memory cell with a second write verify voltage which reflects the actual value of the threshold voltage of the second memory cell.

3. The non-volatile semiconductor memory device as claimed in claim 2, wherein the verify voltage supply circuit comprises first and second verify voltage generating circuits, wherein the first verify voltage generating circuit comprises:

a first resistance element having a first end supplied with a first voltage, and a second end;

a second resistance element having a first end connected to the second end of the first resistance element, and a second end;

a third resistance element having a first end connected to the second end of the second resistance element, and a second end;

a third memory cell which is an electrically erasable and programmable non-volatile memory cell, and has a drain connected to the second end of the third resistance element and a threshold voltage that is set by erase and write operations under a same voltage condition as that for the second memory cell; and a first switch element having a first end connected to a source of the third memory cell, and a second end supplied with a second voltage lower than the first voltage, in which in the erase and write verify operations, the third memory cell and the first switch element are in a conducting state so that the second erase verify voltage is obtained at the second end of the second resistance element and the second write verify voltage is obtained at the first end of the second resistance element, and wherein the second verify voltage generating circuit which supplies, in the erase verify operation, the control gate of the second memory cell with the second erase verify voltage and supplies, in the write verify operation, the control gate of the second memory cell with the second write verify voltage.

4. The non-volatile semiconductor memory device as claimed in claim 1, wherein the verify voltage supply circuit comprises:

a first part which supplies, in the erase verify operation, the control gate of the first memory cell with a third erase verify voltage which reflects the actual value of the threshold voltage of the second memory cell, and supplies, in the write verify operation, the control gate of the first memory cell with a third write verify voltage which reflects the actual value of the threshold voltage of the second memory cell; and a second part which supplies, in the erase verify operation, the control gate of the second memory cell with a fourth erase verify voltage assuming that the threshold voltage of the second memory cell is equal to the target value, and supplies in the write verify operation, the control gate o the second memory cell with a fourth write verify voltage assuming that the threshold voltage of the second memory cell is equal to the target value.

5. The non-volatile semiconductor memory device as claimed in claim 4, wherein the verify voltage supply circuit comprises first and second verify voltage generating circuits, wherein the first verify voltage generating circuit comprises:

a third memory cell which is an electrically erasable and programmable non-volatile memory cell, and has a drain supplied with a first voltage and a threshold voltage that is set by erase and write operations under a same voltage condition as that for the second memory cell;

a first switch element having a first end connected to a source of the third memory cell, and a second end;

a first resistance element having a first end connected to the second end of the first switch element, and a second end;

a second resistance element having a first end connected to the second end of the first resistance element, and a second end;

a third resistance element having a first end connected to the second end of the second resistance element, and a second end supplied with a second voltage lower than the first voltage, in which in the erase and write verify operations, the third memory cell and the first switch element are in a conducting state, so that the third erase verify voltage is obtained at the second end of the second resistance element, and the third write verify voltage is obtained in the first end of the second resistance element, and wherein the second verify voltage generating circuit supplies, in the erase verify operation, the control gate of the first memory cell with the fourth erase verify voltage obtained at the second end of the second resistance element, and supplies, in the write verify operation, the control gate of the first memory cell with the fourth write verify voltage obtained at the first end of the second resistance element.

6. A method of verifying operations of a non-volatile semiconductor memory device comprising:

a first memory cell which is electrically erasable and programmable and stores data;

a second memory cell which is electrically erasable and programmable and has a threshold voltage which is set by performing erase and write operations on the second memory cell separately from erase and write operations on the first memory; and a sense amplifier comparing currents respectively flowing in the first and second memory cells to sense a state of the first memory cell, said method comprising the steps of:

a) supplying, in an erase verify operation, control gates of the first and second memory cells with erase verify voltages dependent on an actual value of the threshold voltage of the second memory cell; and b) supplying, in a write verify operation, the control gates of the first and second memory cells with write verify voltages dependent on an actual value of the threshold voltage of the second memory cell, whereby the erase and write verify operations can duly be carried out even if the threshold voltage of the second memory cell actually derives from a target value.

7. A non-volatile semiconductor memory device comprising:

- a first memory cell which is electrically erasable and programmable and stores data;
- a second memory cell which is electrically erasable and programmable and has a threshold voltage which is set by performing erase and write operations on the second memory separately from erase and write operations on the first memory;
- a sense amplifier comparing currents respectively flowing in the first and second memory cells to sense a state of the first memory cell; and
- a verify voltage supply circuit which supplies, in an erase verify operation, control gates of the first and second memory cells with erase verify voltages dependent on an actual value of the threshold voltage of the second memory cell, whereby the erase verify operation can duly be carried out even if the threshold voltage of the second memory cell actually derives from a target value.

8. A non-volatile semiconductor memory device comprising:

- a first memory cell which is electrically erasable and programmable and stores data;
- a second memory cell which is electrically erasable and programmable and has a threshold voltage which is set by performing erase and write operations on the second memory separately from erase and write operations on the first memory;
- a sense amplifier comparing currents respectively flowing in the first and seconds memory cells to sense a state of the first memory cell; and
- a verify voltage supply circuit which supplies, in a write verify operation, the control gates of the first and second memory cells with write verify voltages dependent on an actual value of the threshold voltage of the second memory cell, whereby the write verify operation can duly be carried out even if the threshold voltage of the second memory cell actually derives from a target value.

* * * * *